United States Patent
Higashida

(10) Patent No.: US 8,328,498 B2
(45) Date of Patent: Dec. 11, 2012

(54) COMPONENT FEEDING UNIT AND METHOD, AND COMPONENT MOUNTING APPARATUS AND METHOD

(75) Inventor: Tadanobu Higashida, Osaka (JP)

(73) Assignee: Panasonic Corporation, Osaka (JP)

( * ) Notice: Subject to any disclaimer, the term of this patent is extended or adjusted under 35 U.S.C. 154(b) by 448 days.

(21) Appl. No.: 12/524,069

(22) PCT Filed: Jan. 25, 2008

(86) PCT No.: PCT/JP2008/051074
§ 371 (c)(1),
(2), (4) Date: Jul. 22, 2009

(87) PCT Pub. No.: WO2008/090976

PCT Pub. Date: Jul. 31, 2008

(65) Prior Publication Data
US 2010/0014948 A1   Jan. 21, 2010

(30) Foreign Application Priority Data

Jan. 25, 2007 (JP) .................. 2007-014406
Jan. 25, 2007 (JP) .................. 2007-014407

(51) Int. Cl.
*B65H 1/00* (2006.01)
(52) U.S. Cl. .................... 414/806; 414/749.4
(58) Field of Classification Search .............. 29/739, 29/740; 414/749.4, 806, 222.05, 222.11, 414/225.01, 802, 816
See application file for complete search history.

(56) References Cited

U.S. PATENT DOCUMENTS

| | | | | |
|---|---|---|---|---|
| 4,144,637 A * | 3/1979 | Ioffe et al. | ........ | 29/739 |
| 6,176,007 B1 * | 1/2001 | Kashiwagi et al. | ........ | 29/729 |
| 6,199,272 B1 * | 3/2001 | Seto et al. | ........ | 29/740 |
| 6,466,837 B1 * | 10/2002 | Mimura et al. | ........ | 700/121 |
| 6,594,887 B1 * | 7/2003 | Okuda et al. | ........ | 29/739 |
| 6,647,616 B1 * | 11/2003 | Matsumura et al. | ........ | 29/771 |
| 7,488,283 B2 * | 2/2009 | Yasui | ........ | 483/1 |
| 2005/0129301 A1 * | 6/2005 | Kanno et al. | ........ | 382/145 |

FOREIGN PATENT DOCUMENTS

JP          5-330626        12/1993
(Continued)

OTHER PUBLICATIONS

International Search Report issued Feb. 19, 2008 in the International (PCT) Application of which the present application is the U.S. National Stage.

(Continued)

*Primary Examiner* — Saul Rodriguez
*Assistant Examiner* — Glenn Myers
(74) *Attorney, Agent, or Firm* — Wenderoth, Lind & Ponack, LLP.

(57) ABSTRACT

In stacking tray supplying for receiving in a stacked state a plurality of trays that are received in a state in which components to be mounted onto a board are aligned, two tray stages are provided rotationally transferably on a concentric circle. In a state in which one is positioned in a feeding tray placement position and the other is positioned in a standby tray placement position, components are fed from the tray stage positioned in the feeding tray placement position. When a component depletion state occurs, the tray stages are rotationally transferred to switchover the mutual placement positions, by which waste of time required to feed components is reduced.

4 Claims, 31 Drawing Sheets

FOREIGN PATENT DOCUMENTS

| | | |
|---|---|---|
| JP | 6-045789 | 2/1994 |
| JP | 7-038287 | 2/1995 |
| JP | 11-163592 | 6/1999 |
| JP | 2000-114783 | 4/2000 |
| JP | 2000-124671 | 4/2000 |
| JP | 2000-299595 | 10/2000 |

OTHER PUBLICATIONS

International Preliminary Report on Patentability and Written Opinion of the International Searching Authority issued Jul. 28, 2009 in International Application PCT/JP2008/051074 (in English).

* cited by examiner

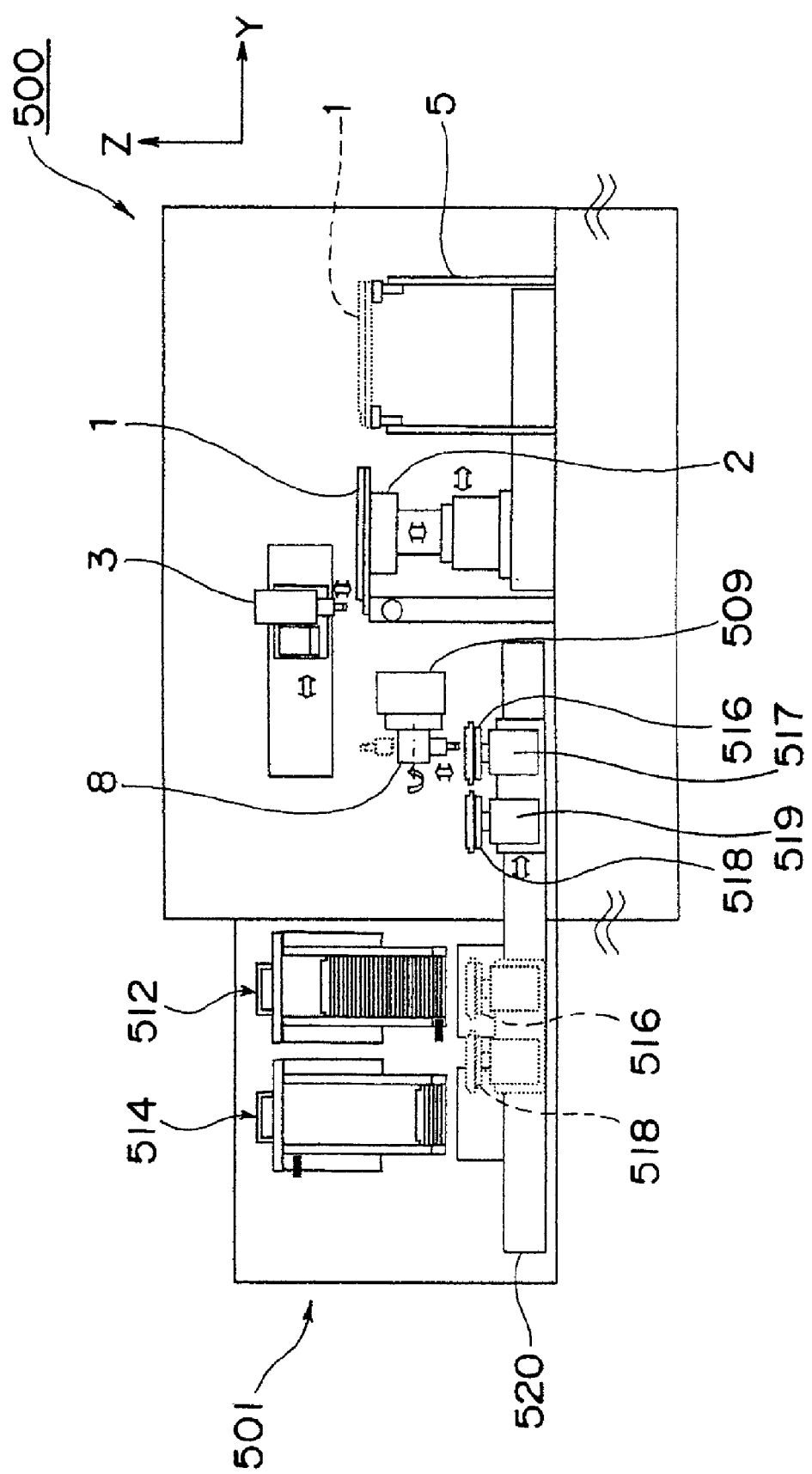

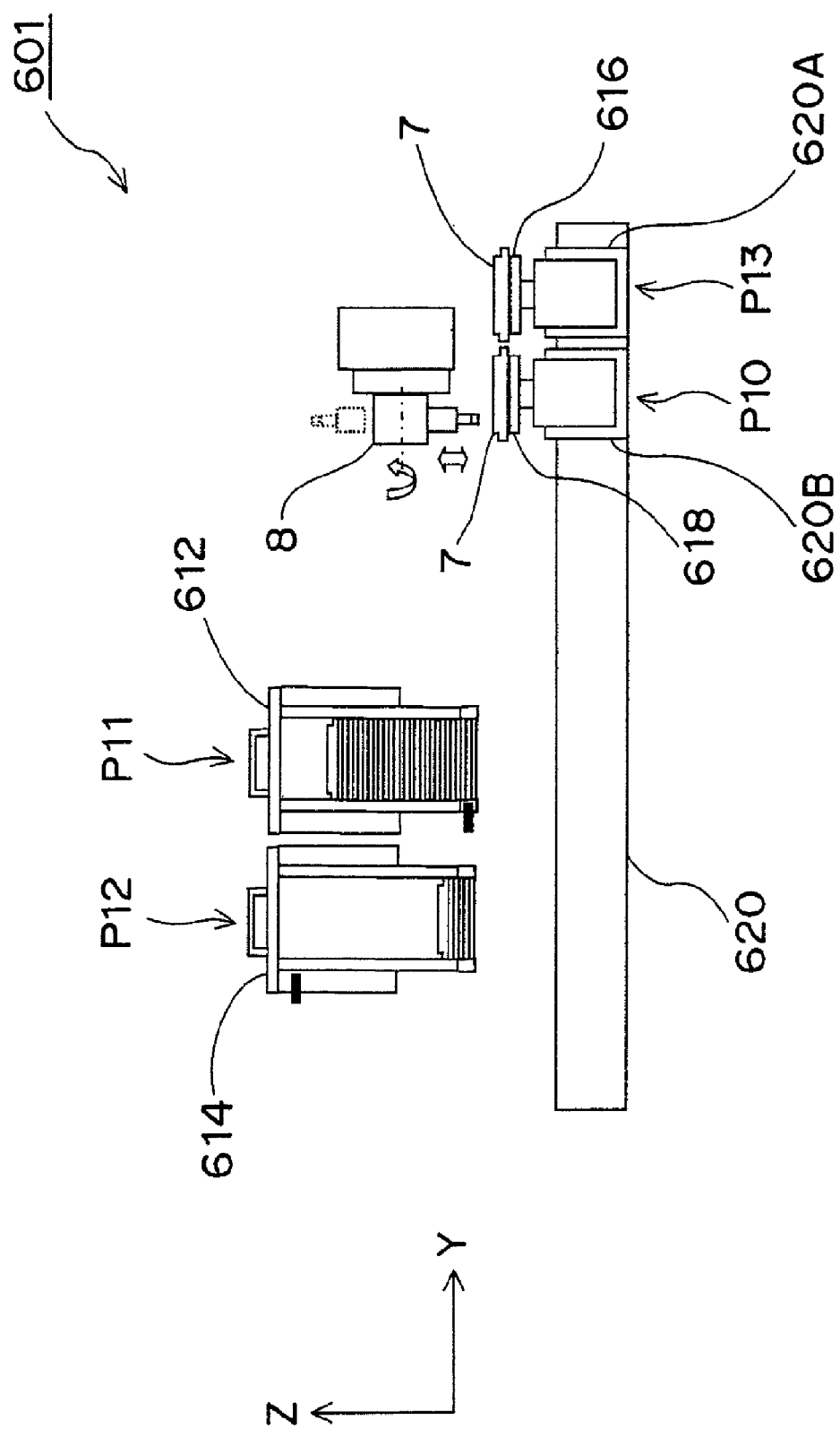

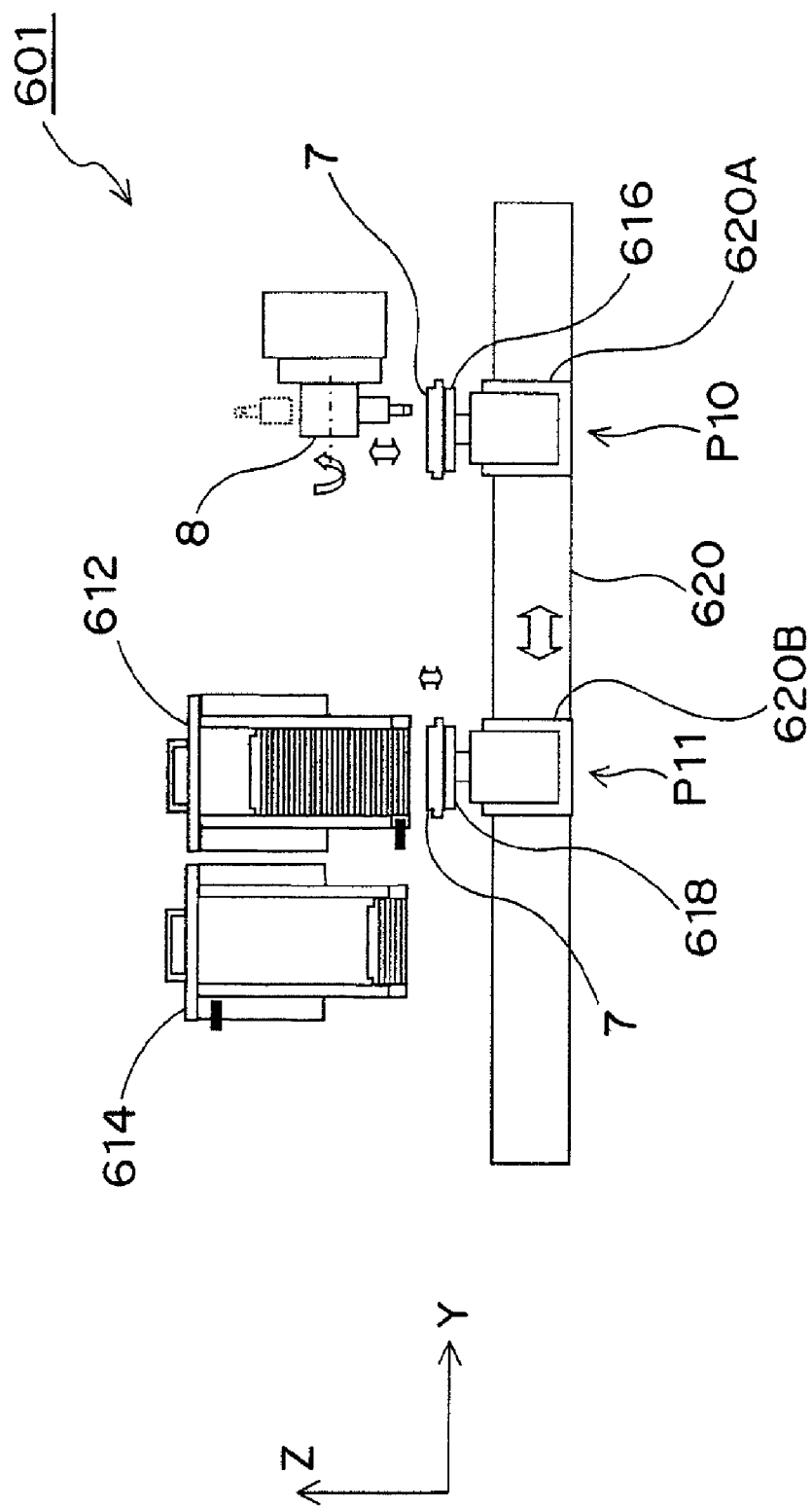

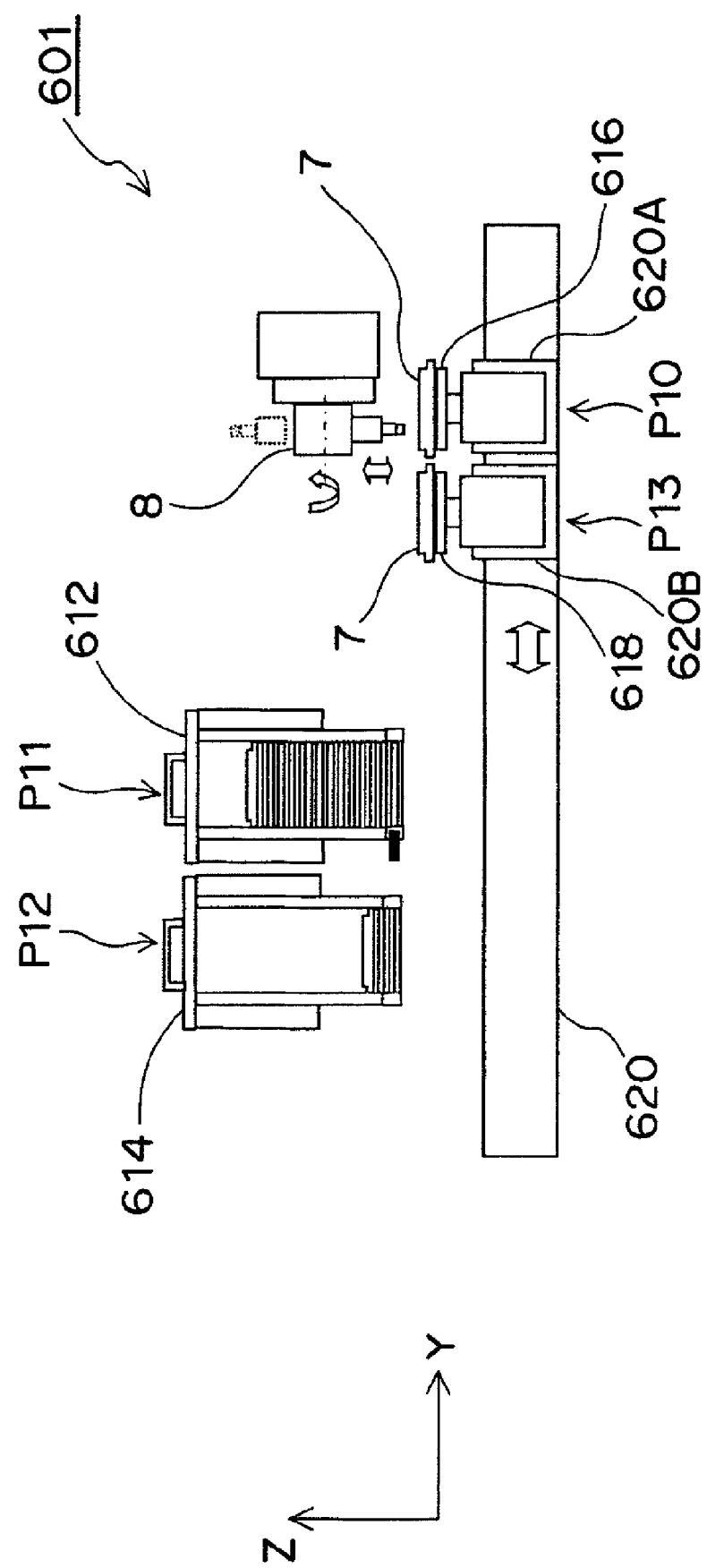

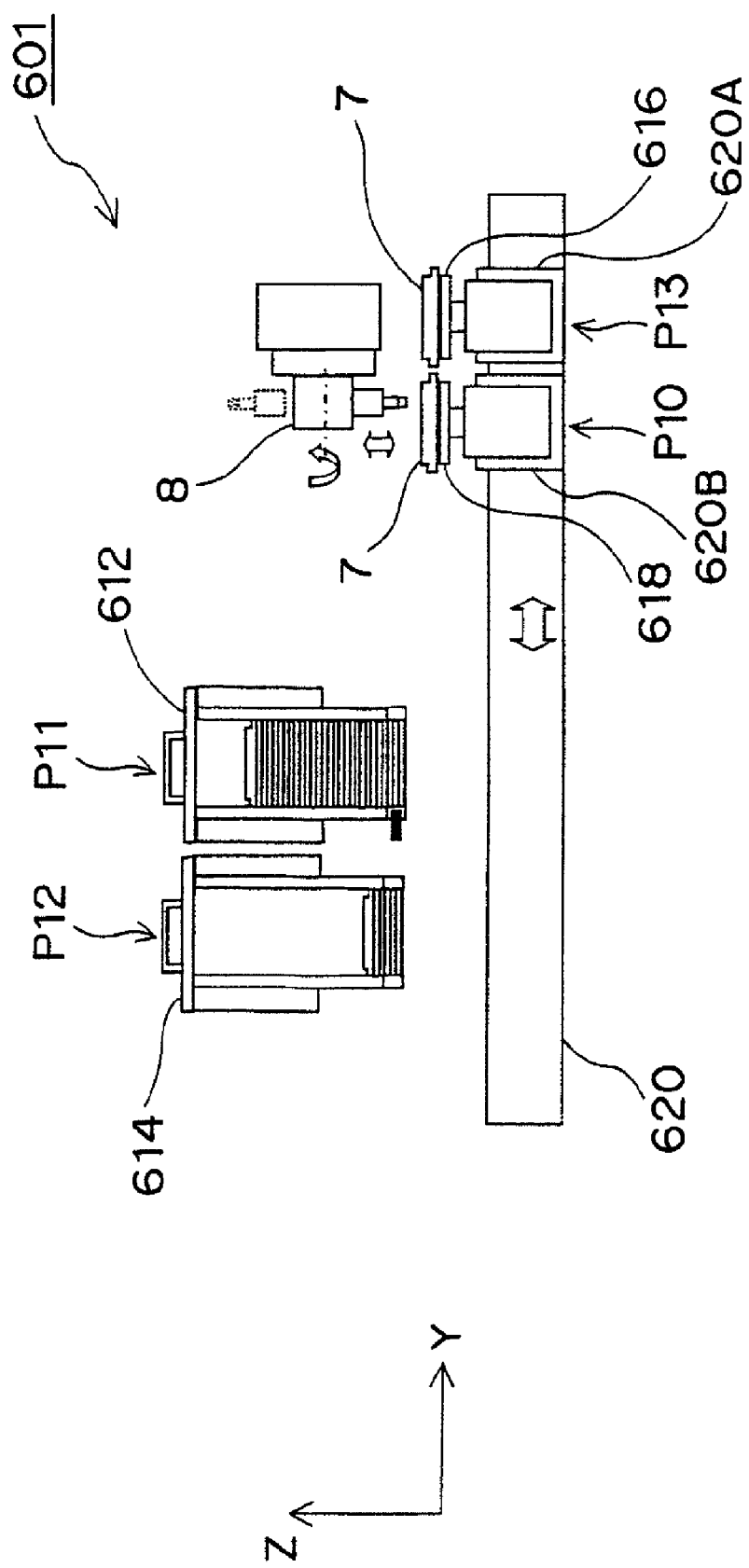

COMPONENT FEEDING UNIT AND METHOD, AND COMPONENT MOUNTING APPARATUS AND METHOD

TECHNICAL FIELD

The present invention relates to a stacking tray supply unit and supply method for receiving in a stacked state a plurality of trays in which components to be mounted onto a board are stored in an aligned state as well as a component mounting apparatus and method for mounting components fed from such a stacking tray.

BACKGROUND ART

Various components such as IC chips and multifariously shaped connectors are automatically handled at high speed in a component mounting apparatus for mounting (or temporarily mounting) components onto a board. It has conventionally been practiced to allow a plurality of components to be collectively handled by storing the components arranged aligned in a tray in such a component mounting apparatus (refer to, for example, Document 1: JP 2000-299595 A).

In such a component mounting apparatus, trays storing a plurality of components and trays in an empty state after finishing component feeding are received in a stacked state, allowing the plurality of trays to be handled compactly efficiently. In concrete, a stacking tray supply unit having a supply side tray receiving unit which receives in a stacked state a plurality of trays and from which the received trays can be successively taken out for component feeding, a collection side tray receiving unit which successively collects empty trays that have been supplied from the supply side tray receiving unit and undergone component feeding and receives the trays in a stacked state, and a tray placing unit that receives and delivers a tray between the unit and the tray receiving units and moves the received tray placed thereon to a component feeding position is used.

Moreover, such a stacking tray supply unit is employed incorporated into a component mounting apparatus. A procedure for feeding components stored in a tray by the stacking tray supply unit is herein described.

In the stacking tray supply unit, one tray is first taken out of the supply side tray receiving unit and delivered to the tray placing unit, and the tray is positioned in the component feeding position by the tray placing unit. Subsequently, an inverting head is moved to a place above the tray positioned in the component feeding position, and one component in the tray is picked up by suction by the inverting head. The inverting head vertically inverts the component sucked and held and thereafter delivers the component to the component mounting head. Subsequently, the component is mounted onto a board by the component mounting head. By repeating the operation as described above, components are successively mounted onto the board.

When the components stored in the tray are depleted in due course, the empty tray is moved by the tray placing unit and delivered to the collection side tray receiving unit, so that the empty tray is collected. Subsequently, a new tray is retaken out of the supply side tray receiving unit from the supply side tray receiving unit and delivered to the tray placing unit. The new tray is positioned in the component feeding position by the tray placing unit, and the component feeding to the inverting head is restarted.

According to the component feeding method by the conventional stacking tray supply unit as described above, when the components are depleted in the tray positioned in the component feeding position and the tray enters the empty state, the component feeding by the inverting head unit is interrupted. By collecting the empty tray to the collection side tray receiving unit by the tray placing unit and thereafter supplying a new tray from the supply side tray receiving unit and positioning the tray in the component feeding position, the component feeding is restarted. This therefore leads to an issue that the component feeding is disadvantageously interrupted while the tray collecting and supplying operations are carried out.

In order to eliminate the interruption time of the component feeding as described above, an apparatus such that the component feeding interruption time is reduced by making the component mounting apparatus has, for example, two stacking tray supply units for supplying trays in which components of the same kind are stored, arranging two trays in two places of the component mounting position and carrying out component feeding alternately from the trays (i.e., carrying out feeding by the alternation method) is used (refer to, for example, Document 2: JP 2000-114783 A and Document 3: JP 2000-124671 A).

However, according to the system as described above, it is necessary to provide the two stacking tray supply units for supplying trays in which components of the same kind are stored, and this causes the problems of an increase in the apparatus cost, an increase in the apparatus space and so on, sometimes posing a factor to hinder the productivity of the component mounting.

An object of the present invention is to solve the above issues and provide a stacking tray supply unit and method, for stacking tray supplying by receiving in a stacked state a plurality of trays in a state in which the components to be mounted onto a board are aligned, capable of achieving high productivity while reducing losses in the machine tact of component feeding attributed to the fact that the components stored in the tray become depleted, as well as a component mounting apparatus and method.

SUMMARY OF THE INVENTION

In order to achieve the above object, the present invention is structured as follows.

According to a first aspect of the present invention, there is provided a stacking tray supply unit which receives in a stacked state a plurality of trays that store components to be mounted onto a board and carries out supplying and collecting of the trays for component feeding, comprising:

a supply side tray receiving unit which receives and supports the plurality of trays in a stacked state while allowing the trays to be successively taken out from a lower side thereof and the trays to be successively placed in a tray supplying position;

a collection side tray receiving unit which successively collects the trays positioned in a tray collecting position from a lower side thereof and receives and supports the trays in a stacked state;

first and second tray stages on which trays are individually placed;

a rotational transfer unit which rotationally transfers the first and second tray stages on a concentric circle while allowing the first and second tray stages to be selectively positioned in a feeding tray placement position where a tray that has undergone component feeding is positioned and a standby tray placement position positioned on the concentric circle with the feeding tray placement position; and a stage moving unit which moves the first or second tray stage positioned in the standby tray placement position into the tray supplying position and the tray collecting position, wherein the rotational transfer unit performs rotational transfer of the first and second tray stages to replace the first tray stage positioned in the feeding tray placement position with the second tray stage positioned in the standby tray placement position, thereby allowing component feeding from the second tray stage to be achieved continuously from the component feeding from the first tray stage.

According to a second aspect of the present invention, there is provided the stacking tray supply unit as defined in the first aspect, wherein the stage moving unit integrally moves the rotational transfer unit with the first and second tray stages.

According to a third aspect of the present invention, there is provided the stacking tray supply unit as defined in the first aspect, wherein the feeding tray placement position, the standby tray placement position, the tray supplying position and the tray collecting position are arranged in one direction, and the stage moving unit advances and retreats either one of the first and second tray stages positioned in the standby tray placement position along the one direction separately from the other tray stage, thereby allowing the tray stage to be positioned in the tray supplying position and the tray collecting position.

According to a fourth aspect of the present invention, there is provided a component mounting apparatus comprising:

the first and second stacking tray supply units as defined in the first aspect for supplying trays in which components of mutually different types are stored;

a board holding unit which holds the board; and a mounting head device which picks up components from a tray positioned in a shared component feeding position used in common by the first and second stacking tray supply units and mounts components of mutually different types onto the board held by the board holding unit, wherein either one tray stage of the tray stage positioned in the feeding tray placement position of the first stacking tray supply unit and the tray stage positioned in the feeding tray placement position of the second stacking tray supply unit is moved by the corresponding stage moving unit and selectively positioned into the shared component feeding position.

According to a fifth aspect of the present invention, there is provided the component mounting apparatus as defined in the fourth aspect, further comprising:

a control unit for controlling the movement positions of the tray stages so that a path of rotational transfer by the rotational transfer unit for replacing the tray stage positioned in the shared component feeding position with the tray stage positioned in the standby tray placement position in one stacking tray supply unit and a path of rotational transfer by the rotational transfer unit for replacing the tray stage positioned in the feeding tray placement position with the tray stage positioned in the standby tray placement position in the other stacking tray supply unit do not interfere with each other.

According to a sixth aspect of the present invention, there is provided the component mounting apparatus as defined in the fourth aspects or fifth aspect, wherein the apparatus further comprises an empty tray detecting unit for detecting that the tray positioned in the shared component feeding position is in an empty state, and, when the empty state is detected by the tray detecting unit, the rotational transfer unit rotationally transfers the tray stages so as to replace the tray stage positioned in the shared component feeding position with the tray stage positioned in the standby tray placement position.

According to a seventh aspect of the present invention, there is provided a component mounting apparatus comprising:

the stacking tray supply unit as defined in claim 1 which feeds a component of a first type by the tray;

a component feeding unit which supplies a component of a second type different from the first type in a component feeding mode different from that of the tray;

a board holding unit which holds the board; and a mounting head device which selectively picks up the component fed by the tray positioned in the feeding tray placement position in the stacking tray supply unit or the component fed in the component feeding mode of the component feeding unit and mounts the component of each of the types onto the board held on the board holding unit, wherein, while the component feeding in the component feeding mode from the component feeding unit is selected and carried out, the stage moving unit moves the tray stage positioned in the standby tray placement position, and delivery of the tray between the tray receiving units is performed.

According to an eighth aspect of the present invention, there is provided a stacking tray supplying method for delivering the tray from a supply side tray receiving unit which receives in a stacked state trays that store components to be mounted onto a board and placing the tray on a tray stage to allow the components to be fed from the tray stage and thereafter moving the tray stage on which the tray that has undergone component feeding is placed to receive the tray into a collection side tray receiving unit and collect the tray in a stacked state, comprising:

positioning a first tray stage on which the tray supplied from the supply side tray receiving unit is placed into a feeding tray placement position where the tray to undergo component feeding is positioned and positioning a second tray stage on which another tray supplied from the supply side tray receiving unit is placed into a standby tray placement position located on a concentric circle with the feeding tray placement position;

carrying out component feeding from the tray placed on the first tray stage positioned in the feeding tray placement position; and thereafter moving the first and second tray stages on the concentric circle to position the second tray stage into the feeding tray placement position and continuously carrying out component feeding from the other tray placed on the second tray stage.

According to a ninth aspect of the present invention, there is provided the stacking tray supplying method as defined in the eighth aspect, wherein the first or second tray stage is positioned into the standby tray placement position by rotationally transferring the tray stages, and delivery of the tray is performed between the first or second tray stage positioned in the standby tray placement position, the supply side tray receiving unit and the collection side tray receiving unit.

According to a tenth aspect of the present invention, there is provided a component mounting method comprising:

feeding components of mutually different types from respective feeding systems to a mounting head device by carrying out the stacking tray supplying method as defined in the eighth aspect or ninth aspect by two supplying systems;

mounting the components fed by the supplying systems onto the board by the mounting head device; and moving the tray stage positioned in the feeding tray placement position into a shared component feeding position which is a position where interference with the tray stages in the other supplying system is prevented and which is used in common by the supplying systems to carry out the component feeding to the mounting head device in one supplying system while performing delivery of the tray between the tray stage positioned in the standby tray placement position and the supply side tray receiving unit and the collection side tray receiving unit in the other supplying system.

According to an eleventh aspect of the present invention, there is provided the component mounting method as defined in the tenth aspect, wherein the rotational transfer of the tray stages for switchover between the tray stage positioned in the shared component feeding position and the tray stage positioned in the standby tray placement position is carried out in the one supplying system while the rotational transfer of the tray stages for switchover between the tray stage positioned in the feeding tray placement position and the tray stage positioned in the standby tray placement position is carried out in the other supplying system.

According to a twelfth aspect of the present invention, there is provided a component mounting method comprising:

by selecting the stacking tray supplying method as defined in claim 8, feeding the component of the first type stored in the tray to the mounting head device and mounting the component of the first type onto the board by the mounting head device;

by selecting a component feeding mode different from that of the tray, feeding the component of the second type different from the first type to the component mounting head device and mounting the component of the second type onto the board by the component mounting head device; and performing delivery of the tray between the tray stage positioned in the standby tray placement position and the supply side tray receiving unit and the collection side tray receiving unit while the component feeding in the different component feeding mode is selected and carried out.

Each of the above embodiments can be applied to an apparatus or method for mounting (or temporarily mounting) components such as IC chips, various kinds of connectors and so on fed in a state stored in a tray form onto the source side and gate side terminal portions of, for example, an LCD panel board as the board.

Moreover, a structure such that the components to be mounted onto, for example, the source side terminal portion of an LCD panel board are fed by the first stacking tray supply unit and the components to be mounted onto the gate side terminal portion are fed by the second stacking tray supply unit can be adopted.

Moreover, TCP components fed by a TCP feeder unit can also be subject to application as components of different types fed in a component feeding mode different from the tray form. That is, the component mounting apparatus may have both of a component feeding unit for feeding components by a tray and a component feeding unit for feeding TCP components.

According to the invention, by virtue of the provision of the first and second tray stages, which are arranged on the concentric circle and able to be switched over by rotational transfer, even when the tray placed on one tray stage enters a component depletion state (empty state), the tray on the one tray stage can be easily promptly replaced by the tray placed on the other tray stage by rotationally transferring the first and second tray stages. Therefore, the interruption time of the component feeding can be reduced to an extremely short time. That is, waste of time required to conduct the component feeding attributed to the fact that the tray enters the empty state can be reduced, and efficient and substantially continuous component feeding can be achieved with a comparatively simple structure.

BRIEF DESCRIPTION OF DRAWINGS

These aspects and features of the present invention will become clear from the following description taken in conjunction with the preferred embodiments thereof with reference to the accompanying drawings, in which:

FIG. 16 is a schematic side view of the component mounting apparatus of FIG. 14;

FIG. 19A is a schematic side view showing the tray supplying operation according to a modification example of the fifth embodiment, in a state in which component feeding is started;

FIG. 19C is a schematic side view showing the tray supplying operation following FIG. 19B, in a state in which a new tray is placed on the other tray stage while component feeding from one tray stage is carried out;

FIG. 19D is a schematic side view showing the tray supplying operation following FIG. 19C, in a state in which the other tray stage, on which a new tray is placed, is positioned in a standby tray placement position;

FIG. 19E is a schematic side view showing the tray supplying operation following FIG. 19D, in a state in which the tray stage switchover operation is carried out and component feeding from the other tray stage on which a new tray is placed is carried out;

DETAILED DESCRIPTION OF THE INVENTION

Figure 1:
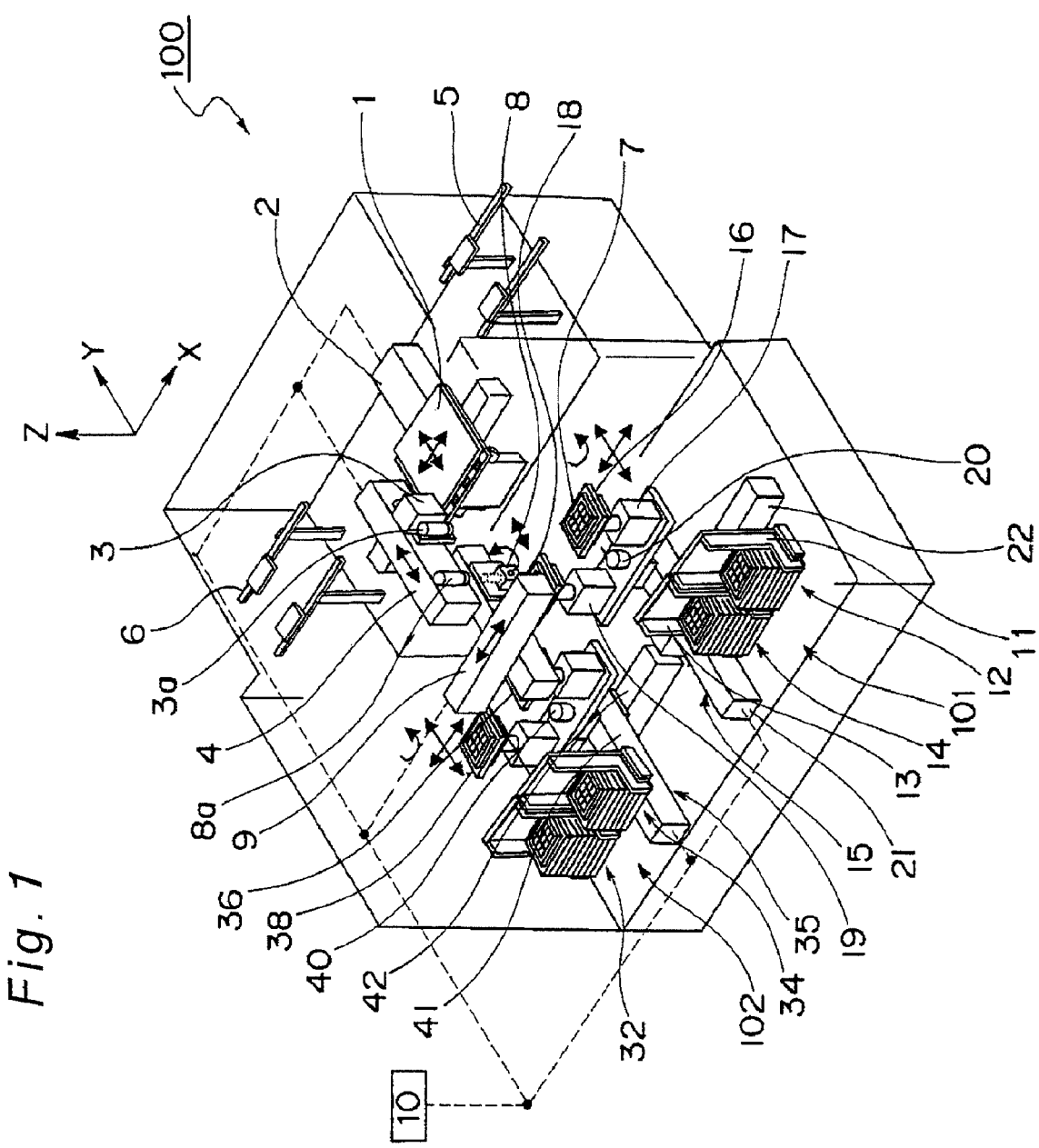
FIG. 1 is a schematic structural view of a component mounting apparatus according to a first embodiment of the invention.

Before the description of the present invention proceeds, it is to be noted that like parts are designated by like reference numerals throughout the accompanying drawings.

Hereinbelow, embodiments according to the present invention will be described in detail with reference to the accompanying drawings.

The First Embodiment

FIG. 1 is a schematic structural view showing the schematic structure of a component mounting apparatus 100 hav-ing two stacking tray supply units as one example of the stacking tray supply unit according to the first embodiment of the invention. The component mounting apparatus 100 shown in FIG. 1 is the apparatus for mounting (temporarily mounting) components such as IC chips or various kinds of connectors fed in a state stored in a tray form onto the source side and gate side terminal portions of, for example, an LCD panel board serving as the board.

As shown in FIG. 1, the component mounting apparatus 100 has a panel placement stage 2 (as one example of the board holding unit) having a function to releasably retain an LCD panel board 1 and perform transfer of the retained panel board 1 in the illustrated X-axis direction and Y-axis direction as well as rotational transfer (θ rotational transfer) in the X-Y plane, a temporary mounting head unit 3 for mounting (temporarily mounting) components onto the terminal portions of the panel board 1 retained on the panel placement stage 2, and a temporary mounting head moving unit 4 for supporting the temporary mounting head unit 3 and moving the same in the Y-axis direction. Moreover, the component mounting apparatus 100 has a panel board loader 5 for conveying and supplying the panel board 1 from outside the apparatus onto the panel placement stage 2, and a panel board unloader 6 for taking out the panel board 1, on which components have been temporarily mounted, from on the panel placement stage 2 and conveying and discharging the panel board to the outside of the apparatus. The component mounting apparatus 100 further includes an inverting head unit 8 for picking up by sucking and holding the component stored in a tray 7, which has been supplied from the stacking tray supply unit and positioned in a component feeding position described later, vertically inverting the component and thereafter delivering the component sucked and held to the temporary mounting head unit 3, and an inverting head moving unit 9 for supporting the inverting head unit 8 and moving the same in the X-axis direction and the Y-axis direction. In FIG. 1, the X-axis direction and the Y-axis direction are perpendicular to each other in the horizontal plane, and the Z-axis direction is perpendicular to these directions. Moreover, in the first embodiment, one example of the mounting head unit is constituted of the temporary mounting head unit 3, the temporary mounting head moving unit 4, the inverting head unit 8 and the inverting head moving unit 9.

Moreover, as shown in FIG. 1, the component mounting apparatus 100 has two stacking tray supply units 101 and 102 for supplying trays in which components of mutually different types are stored. The first stacking tray supply unit 101 and the second stacking tray supply unit 102 are provided on the front side and the rear side, respectively, in the illustrated X-axis direction. Since the tray supply units 101 and 102 have identical structures, the structure of the first stacking tray supply unit 101 is mainly described in the following description.

As shown in FIG. 1, the first stacking tray supply unit 101 has a supply side stocker 12 (one example the supply side tray receiving unit) equipped with a stacking cassette 11 (one example of the lodging body) for lodging in a stacked state a plurality of trays in which a plurality of components are stored, a collection side stocker 14 (one example of the collection side tray receiving unit) equipped with a stacking cassette 13 (one example of the lodging body) for collecting in a stacked state a plurality of empty trays that have undergone component feeding, and a tray transfer device 15 for receiving the tray supplied from the supply side stocker 12, transferring the tray to a prescribed position such as a component feeding position described later, transferring the tray that has entered the empty state as a consequence of feeding components to the component feeding position and making the collection side stocker 14 collect the tray.

Figure 2:
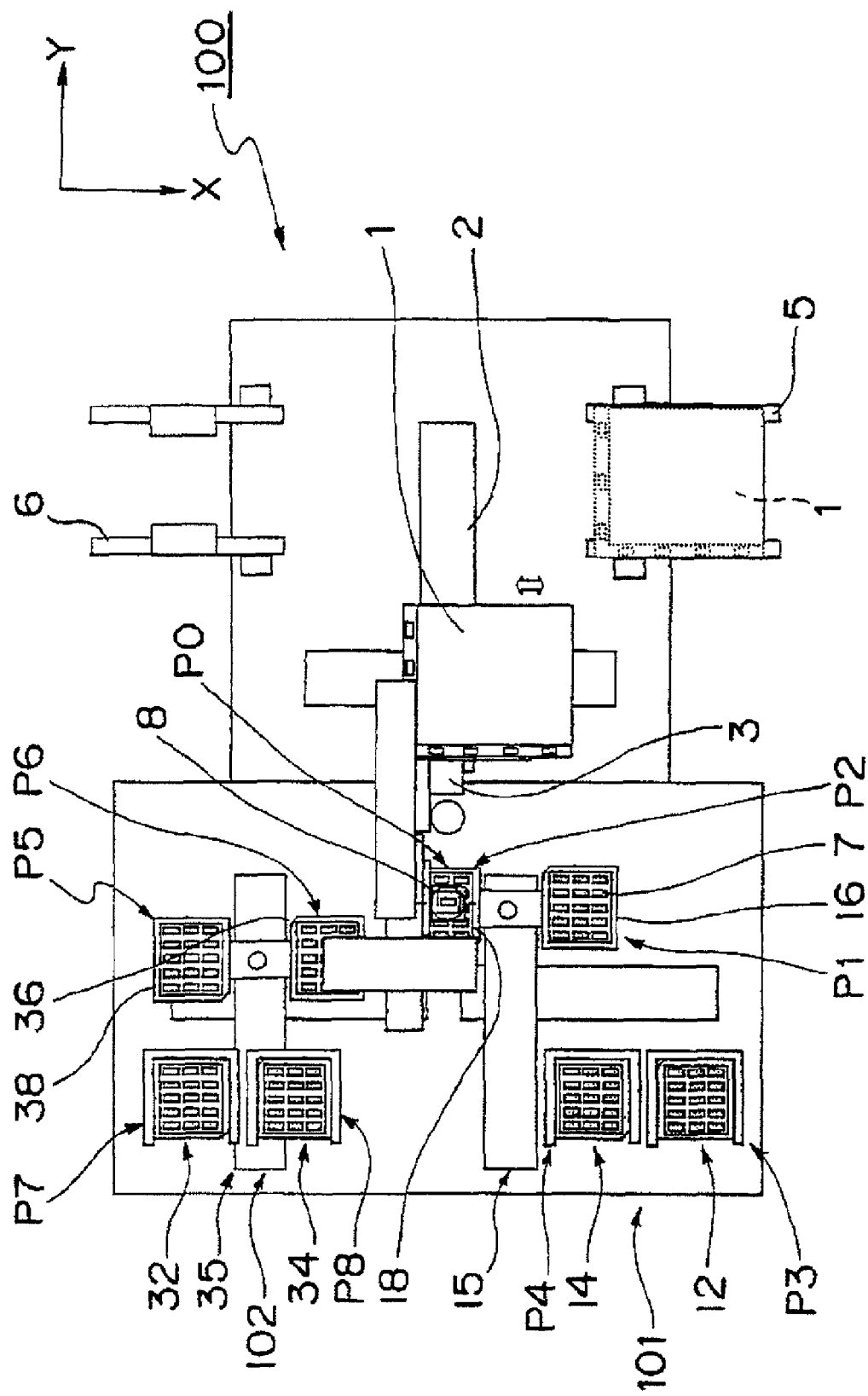
FIG. 2 is a schematic plan view of the component mounting apparatus of FIG. 1.
Figure 3:
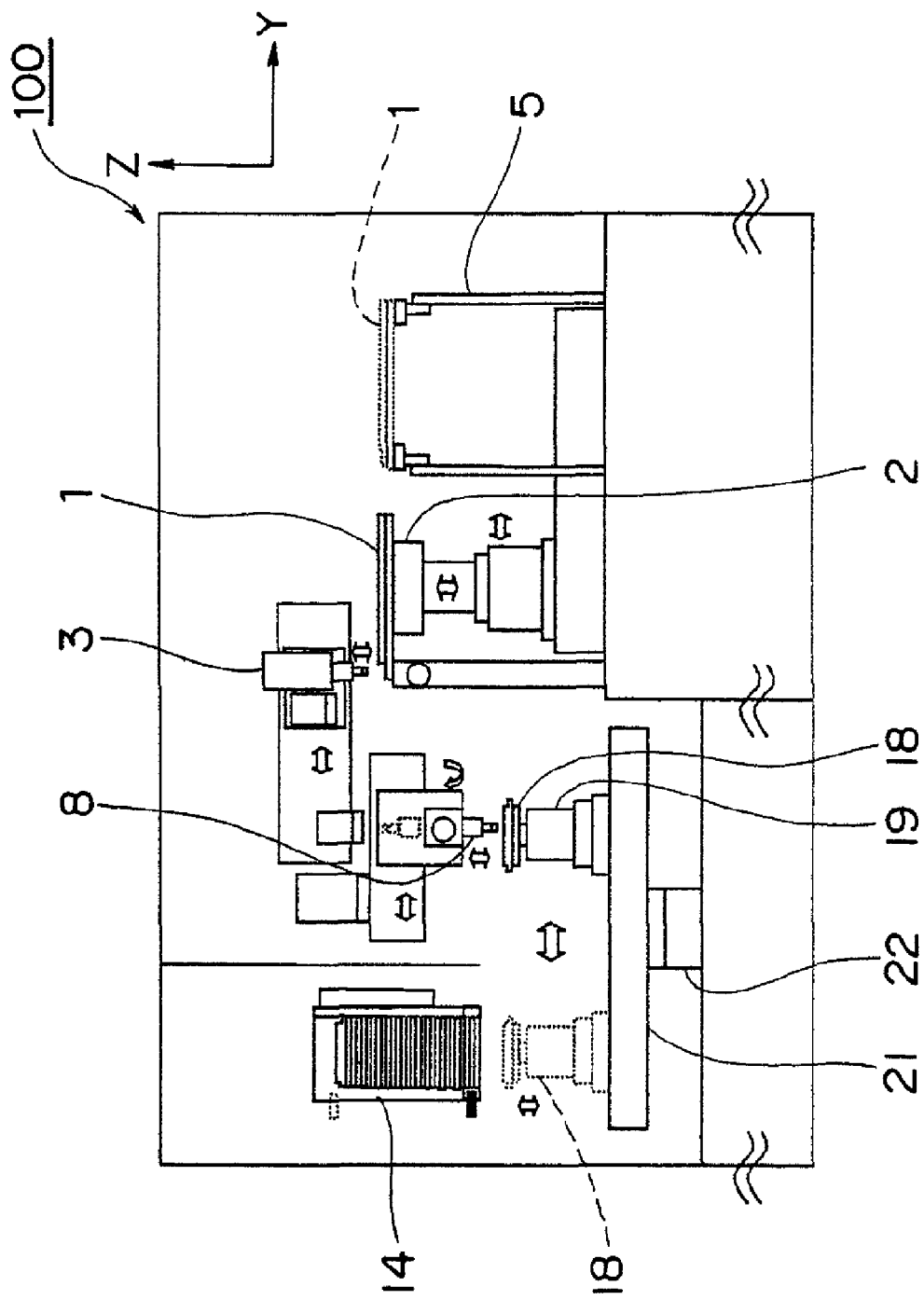
FIG. 3 is a schematic side view of the component mounting apparatus of FIG. 1.

A schematic plan view of the component mounting apparatus 100 is shown in FIG. 2, and a schematic side view of the apparatus is shown in FIG. 3. As shown in FIGS. 1, 2 and 3, a plurality of trays 7 are received in a stacked form in the supply side stocker 12, and the trays 7 are taken out one by one from an opening provided on the lower side of the stacking cassette 11 by the tray transfer device 15. Likewise, empty trays 7 that have undergone component feeding are received stacked in the collection side stocker 14 inside the stacking cassette 13, and the empty trays 7 are collected one by one from the tray transfer device 15 through an opening provided on the lower side of the stacking cassette 13. Moreover, the stacking cassettes 11 and 13 are detachable from the respective stockers 12 and 14. The detachable arrangement of the stacking cassettes 11 and 13 makes it possible to supplement new trays 7 and withdraw (dislodge) empty trays 7.

Moreover, the tray transfer device 15 has two tray stages 16 and 18 (one example of first and second tray stages) on which the trays 7 are placed and retained, stage lifts 17 and 19 for individually moving up and down the tray stages 16 and 18, a rotational transfer unit 20 for performing switchover between the tray stages 16 and 18 and the stage lifts 17 and 19 by integral rotational transfer, a Y-axis direction stage moving unit 21 for integrally moving the tray stages 16 and 18, the stage lifts 17 and 19 and the rotational transfer unit 20 in the illustrated Y-axis direction, and an X-axis direction stage moving unit for integrally moving them in the illustrated X-axis direction.

The two tray stages 16 and 18 provided at the tray transfer device 15 are positioned in either a feeding tray placement position P2 where the tray 7 to carry out component feeding is positioned or a standby tray placement position P1 arranged on a concentric circle with the feeding tray placement position P2. The rotational transfer unit 20 rotationally transfers the tray stages 16 and 18 on the concentric circle to carry out the switchover operation of the tray stages 16 and 18 positioned in the feeding tray placement position P2 and the standby tray placement position P1.

The X-axis direction stage moving unit 22 and the Y-axis direction stage moving unit 21 can integrally move the tray stages 16 and 18 in the X-axis direction and the Y-axis direction in a manner that either one of the tray stages 16 and 18 positioned in the feeding tray placement position P2 is positioned into the component feeding position P0 located below the moving range of the inverting head unit 8. Moreover, the X-axis direction stage moving unit 22 and the Y-axis direction stage moving unit 21 can integrally move the tray stages 16 and 18 in the X-axis direction and the Y-axis direction in a manner that either one of the tray stages 16 and 18 positioned in the standby tray placement position P1 is selectively positioned into a tray supplying position P3 located below the supply side stocker 12 and a tray collecting position P4 located below the collection side stocker 14. As shown in FIG. 2, in the first stacking tray supply unit 101, the standby tray placement position P1 and the feeding tray placement position P2 are arranged mutually adjacently along the X-axis direction, and the feeding tray placement position P2 is positioned on the center side of the apparatus in the X-axis direction. Moreover, the tray supplying position P3 and the tray collecting position P4 are arranged mutually adjacently along the X-axis direction, and the tray collecting position P4 is arranged on the center side of the apparatus in the X-axis direction. It is noted that the X-axis direction stage moving unit 22 and the Y-axis direction stage moving unit 21 as described above are each constructed of, for example, a ball screw mechanism and/or a linear motor mechanism.

The stage lifts 17 and 19 move up and down the tray stages 16 and 18 between a stage movement height position that is a height position where the tray stages 16 and 18 are prevented from coming in contact with the respective stockers 12 and 14 when the tray stages 16 and 18 are moved by the X-axis direction stage moving unit 22 and the Y-axis direction stage moving unit 21 and a tray delivery height position that is a height position where the delivery (supply or collection) of the tray 7 is performed with the respective stockers 12 and 14. It is noted that the tray stages 16 and 18 and the respective stacking cassettes 11 and 13 have delivery means (mechanism) (not shown) for delivering the received one tray 7 to the tray stages 16 and 18 or delivering the one tray 7 retained on the tray stages 16 and 18 to the stacking cassette 13 by moving up and down the tray stages 16 and 18 to the tray delivery height position.

Moreover, the second stacking tray supply unit 102 has a structure similar to that of the first stacking tray supply unit 101 structured as above and has an arrangement of line symmetry with respect to the Y-axis serving as a reference as shown in FIGS. 1 and 2. In concrete, a supply side stocker 32, a collection side stocker 34 and a tray transfer device 35 are provided. The tray transfer device 35 has a rotational transfer unit 40 for rotationally transferring two tray stages 36 and 38 arranged on a concentric circle, an X-axis direction stage moving unit 42 and a Y-axis direction stage moving unit 41 for X-Y transfer. Moreover, as shown in FIG. 2, a standby tray placement position P5, a feeding tray placement position P6, a tray supplying position P7 and a tray collecting position P8 are arranged in an arrangement of line symmetry with respect to the first stacking tray supply unit 101 and the Y-axis serving as a reference. It is noted that the component feeding position P0 serves as a position shared by the first stacking tray supply unit 101 and the second stacking tray supply unit 102, i.e., a shared component feeding position. That is, it is possible to selectively position one tray stage 16, 18, 36, 38 positioned in either one of the feeding tray placement positions P2 and P6 of the stacking tray supply units 101 and 102 into the component feeding position P0. For example, a tray 7 for feeding components to be mounted onto the source side terminal portion of the LCD panel board 1 is received in the first stacking tray supply unit 101, and a tray 7 for feeding components to be mounted onto the gate side terminal portion is received in the second stacking tray supply unit 102.

The component mounting apparatus 100 further includes a control unit 10 that controls the supplying operation and the collecting operation of the tray 7 by the first stacking tray supply unit 101 and the second stacking tray supply unit 102 while interlinking the operations and controls the temporary mounting operation of the components picked up from the supplied tray 7 onto the board 1.

Next is described the mounting (temporary mounting) operation of the components stored in the trays supplied from the stacking tray supply units 101 and 102 onto the LCD panel board 1 in the component mounting apparatus 100 structured as above. For the explanation, a flow chart of the procedure of the component mounting operation is shown in FIG. 4.

Figure 4:
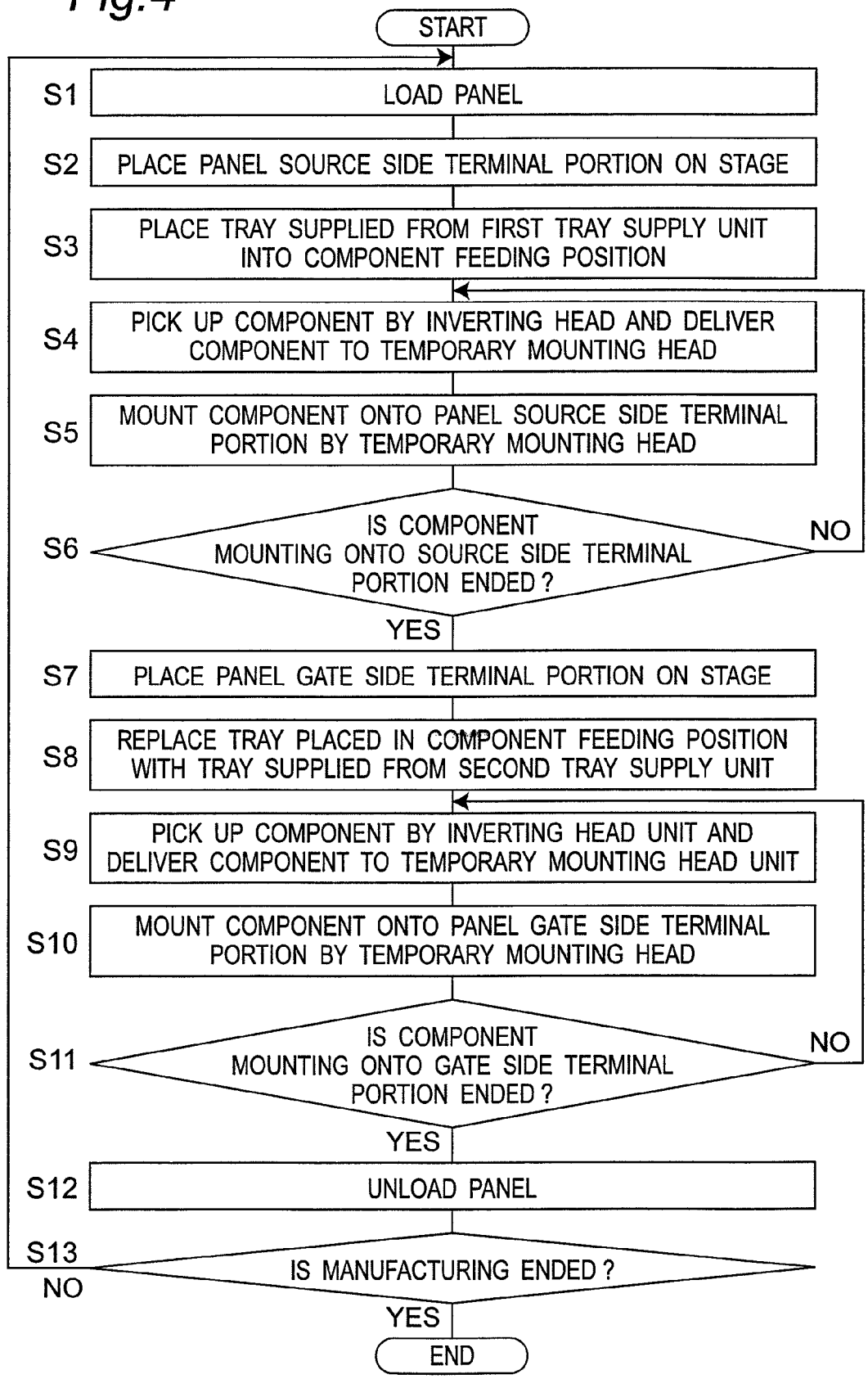
FIG. 4 is a flow chart of a component mounting operation in the component mounting apparatus of the first embodiment.

First of all, in the component mounting apparatus 100, the LCD panel board 1 is loaded by the panel board loader 5 and placed on the panel placement stage 2 while being positioned so that the component mounting operation is carried out on the source side terminal portion of the panel board 1 (steps S1 and S2 in the flow chart of FIG. 4). Further, in the first stacking tray supply unit 101, the tray stage 18 (or 16) positioned in the feeding tray placement position P2 is moved to the component feeding position P0, and the tray 7 is placed in the component feeding position P0 (step S3).

Next, one component is picked up by suction from the tray 7 placed in the component feeding position P0 by the inverting head unit 8 and vertically inverted, and thereafter, the component is delivered to the temporary mounting head unit 3 (step S4). Subsequently, the component sucked and held by the temporary mounting head unit 3 is aligned in position with the component mounting position in the source side terminal portion of the LCD panel board 1 placed on the panel placement stage 2, and the component is mounted (temporarily mounted) by the temporary mounting head unit 3 (step S5). The above operation by the inverting head unit 8 and the temporary mounting head unit 3 will be successively repeated until the mounting of all the components on the source side terminal portion is ended (step S6). A recognition camera 8a for recognizing the positions of the components stored in the tray 7 is provided for the inverting head unit 8, and the components are picked up on the basis of recognition results by the recognition camera 8a. Moreover, a recognition camera 3a for recognizing the mounting positions of the components on the LCD panel board 1 is provided for the temporary mounting head unit 3, and the mounting of the components is carried out on the basis of recognition results by the recognition camera 3a.

When the mounting of components on the source side terminal portion is completed, the LCD panel board 1 is turned by 90 degrees in the X-Y plane by the panel placement stage 2 and positioned so that the component mounting operation is carried out on the gate side terminal portion (step S7). Further, the tray 7 placed in the component feeding position P0 is replaced by a tray 7 supplied from the second stacking tray supply unit 102, and the tray is placed (step S8). Subsequently, a component fed from the tray 7 positioned in the component feeding position P0 is sucked and held by the temporary mounting head unit 3 via the inverting head unit 8 and mounted onto the gate side terminal portion of the LCD panel board 1 (steps S9, S10, S11).

Subsequently, upon confirming that the mounting of components on the gate side terminal portion is completed, i.e., confirming that the mounting (temporary mounting) of the components onto the LCD panel board 1 is completed (step S11), the LCD panel board 1 is delivered from the panel placement stage 2 to the panel board unloader 6 and unloaded from the component mounting apparatus 100 (step S12). After the unloading, it is determined whether the manufacturing, i.e., mounting of the next LCD panel board 1 is to be carried out (step S13), and the next panel board 1 is loaded when mounting is carried out (step S1).

Figure 5:
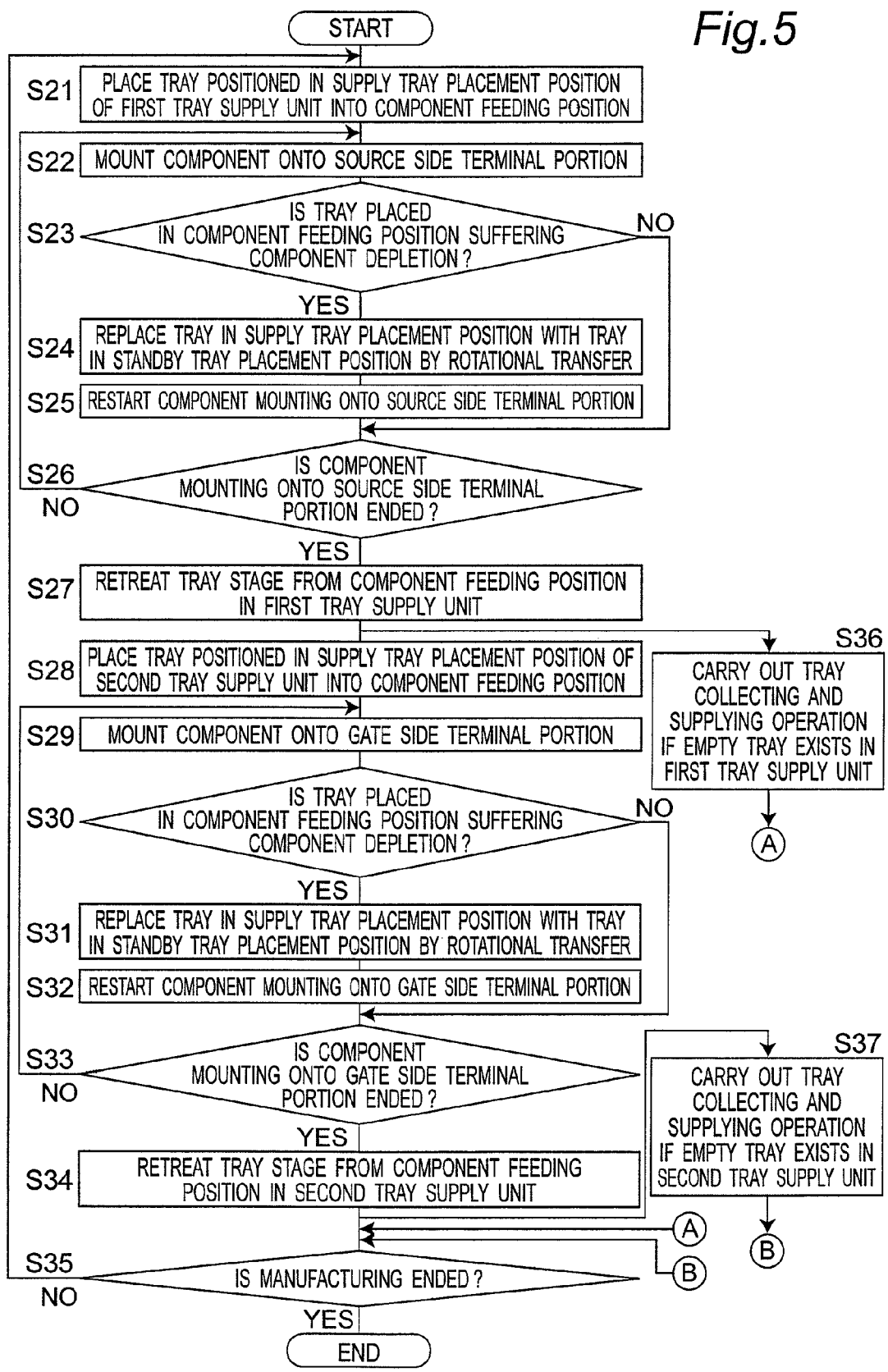
FIG. 5 is a flow chart of a tray supplying operation in the component mounting apparatus of the first embodiment.

Operation of substantially continuously carrying out the component feeding by switchover to the other tray stage when the component depletion occurs in one tray stage positively taking advantage of the fact that the first stacking tray supply unit 101 and the second stacking tray supply unit 102 have two tray stages 16, 18 and 36, 38, respectively, is described next. For the explanation, a flow chart of an operation procedure is shown in FIG. 5, and schematic explanatory views of the operation procedure are shown in FIGS. 6A through 6E. It is noted that the schematic explanatory views of FIGS. 6A through 6E are the figures intended mainly to illustrate the positional relations between the tray stages in the first and second stacking tray supply units 101 and 102, and the tray stages 16, 18, 36 and 38, the stockers 12, 14, 32 and 34, and the tray transfer devices 15 and 35 are only shown.

Figure 6A:
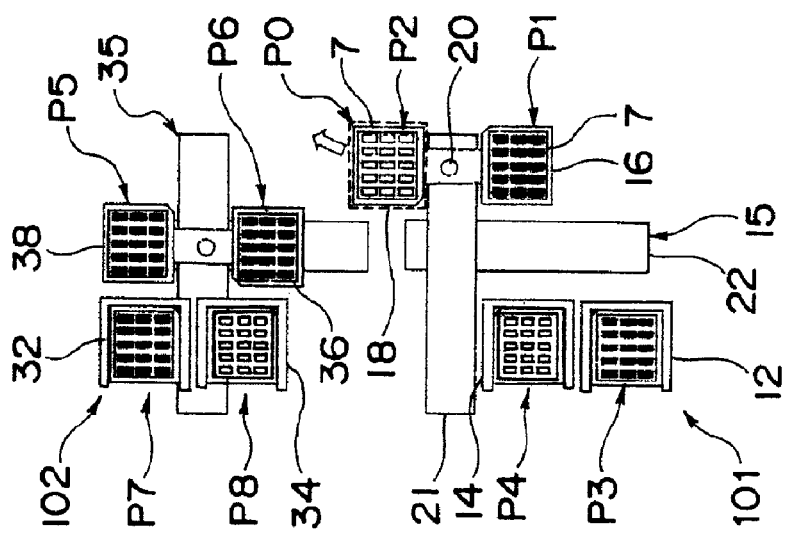
FIG. 6A is a schematic explanatory view of the tray supplying operation of FIG. 5, in a state in which the components to be mounted onto the source side terminal portion are fed.

First of all, in carrying out the component mounting onto the LCD panel board 1 loaded to the component mounting apparatus 100, the tray stages 16 and 18 on which the trays 7 are placed are moved by the X-axis direction and Y-axis direction stage moving units 22 and 21 in the first stacking tray supply unit 101 as shown in FIG. 6A. The tray stage 18 (or "16") positioned in the feeding tray placement position P2 is positioned into the component feeding position P0 (step S21 in the flow chart of FIG. 5). Subsequently, components are picked up by the inverting head unit 8 from the tray 7 placed on the tray stage 18 positioned in the component feeding position P0, and component mounting onto the source side terminal portion of the panel board 1 is started (step S22).

Figure 6B:
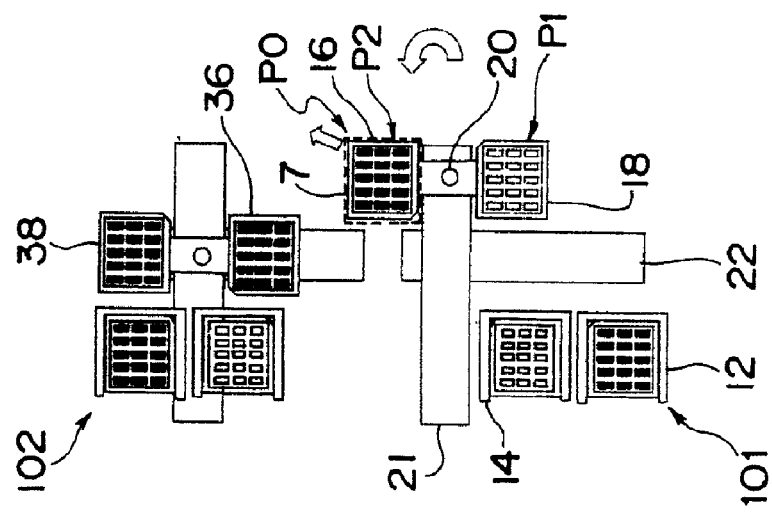
FIG. 6B is a schematic explanatory view of the tray supplying operation following FIG. 6A, in a state in which the tray that suffers component depletion is replaced by rotational transfer.

When the components in the tray 7 positioned in the component feeding position P0 are depleted in the course of the component mounting continuously carried out and an empty state, i.e., a component depletion state occurs (step S23), the rotational transfer of the tray stages 16 and 18 is performed by the rotational transfer unit 20 as shown in FIG. 6B, so that the tray stage 18 positioned in the feeding tray placement position P2 is replaced by the tray stage 16 (or "18") positioned in the standby tray placement position P1 (step S24). That is, the tray 7 in the empty state is replaced by the tray 7 in which components are stored by the rotational transfer, and the tray 7 in which the components are stored is positioned in the component feeding position P0, making the component feeding possible. Subsequently, the component mounting onto the source side terminal portion is restarted (step S25). It is noted that the component feeding position P0 and the arrangement positions P1 through P8 are set so that, even when the rotational transfer of the tray stages 16 and 18 is performed in the first stacking tray supply unit 101, the rotational transfer does not interfere with the tray stages 36 and 38 in the second stacking tray supply unit 102.

Figure 6C:
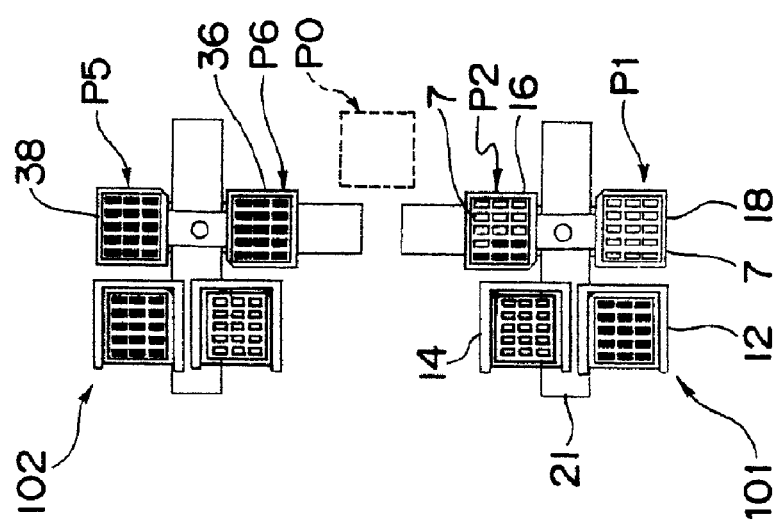
FIG. 6C is a schematic explanatory view of the tray supplying operation following FIG. 6B, in a state in which the feeding of components to be mounted onto the source side terminal portion is ended.
Figure 6D:
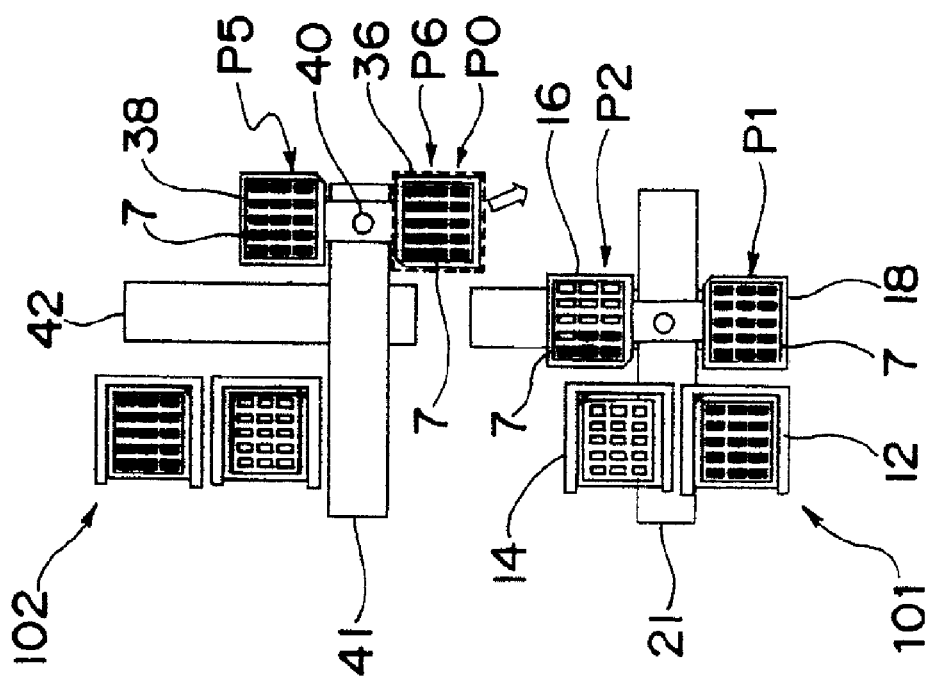
FIG. 6D is a schematic explanatory view of the tray supplying operation following FIG. 6C, in a state in which the components to be mounted onto the gate side terminal portion are fed.

Subsequently, upon confirming that the component mounting onto the source side terminal portion is ended (step S26), the tray stages 16 and 18 are moved by the X-axis direction and Y-axis direction stage moving units 22 and 21, respectively, in the first stacking tray supply unit 101 as shown in FIG. 6C, and the tray stage 16 retreats from the component feeding position P0 (step S27). Subsequently, the tray stages 36 and 38 on which the trays 7 are placed are moved by the X-axis direction and Y-axis direction stage moving units 42 and 41 in the second stacking tray supply unit 102 as shown in FIG. 6D, and the tray stage 36 (or "38") positioned in the feeding tray placement position P6 is positioned into the component feeding position P0 (step S28). Subsequently, components are picked up from the tray 7 placed on the tray stage 36 positioned in the component feeding position P0 by the inverting head unit 8, and the component mounting onto the gate side terminal portion of the panel board 1 is started (step S29).

Figure 6E:
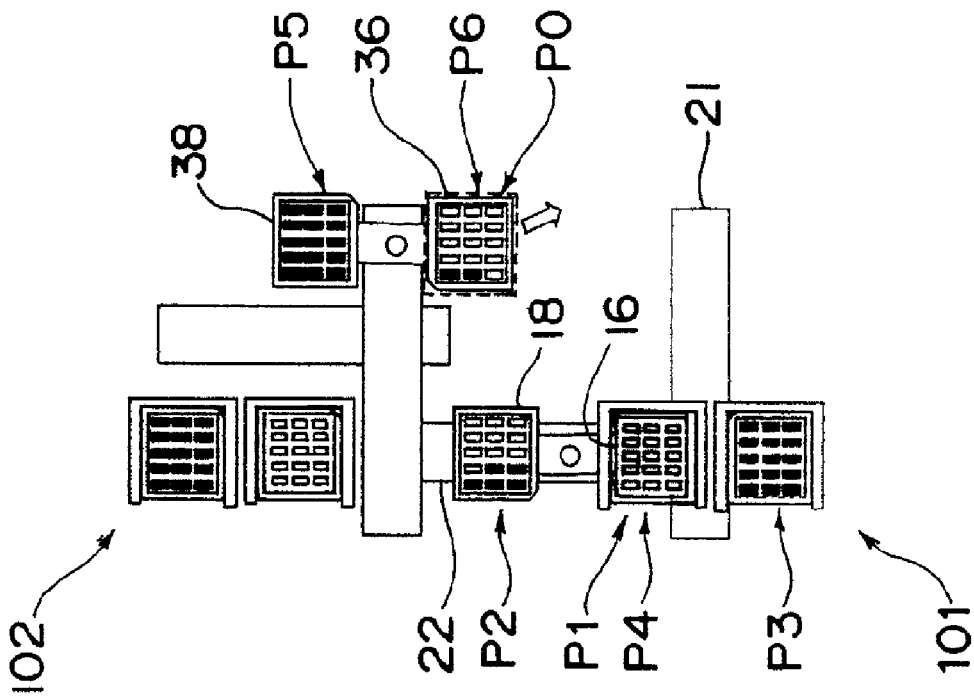
FIG. 6E is a schematic explanatory view of the tray supplying operation following FIG. 6D, in a state in which empty tray collecting operation is carried out in a first stacking tray supply unit.

While the component feeding by the second stacking tray supply unit 102 is carried out and the component mounting onto the gate side terminal portion is continuously carried out, the collecting operation of the empty tray 7 and the supplying operation of a new tray 7 are carried out in the first stacking tray supply unit 101 (step S36). In concrete, the tray stages 16 and 18 are moved in the X-Y directions by the X-axis direction and Y-axis direction stage moving units 22 and 21 in the first stacking tray supply unit 101 as shown in FIG. 6E, and the tray stage 18 positioned in the standby tray placement position P1 where the empty tray 7 is placed is positioned into the tray collecting position P4 that is a position below the collection side stocker 14. In this state, the empty tray 7 is moved up to a prescribed height position by the stage lift 19, and the empty tray 7 is delivered to the inside of the stacking cassette 13. In this case, the tray stage 16 positioned in the feeding tray placement position P2 is to be positioned in between the first stacking tray supply unit 101 and the second stacking tray supply unit 102 as shown in FIG. 6E. Since a space where the interference with the second stacking tray supply unit 102 is prevented is secured in this portion, the collecting operation of the tray 7 can be carried out without causing interference between the members. Subsequently, the tray stage 18, which has delivered the empty tray 7, is moved to the tray supplying position P3 that is a position below the supply side stocker 12, and a new tray 7 is supplied from the stacking cassette 11 and placed. In carrying out the collecting operation of the tray 7 placed on the tray stage 16 positioned in the feeding tray placement position P2, the tray stage 16 is positioned into the standby tray placement position P1 by rotational transfer by the rotational transfer unit 20. Thereafter, the collecting operation of the tray 7 and the supplying operation of a new tray 7 can be carried out in a procedure similar to the procedure described above. By virtue of the adopted structure such that the collecting operation and the supplying operation of the trays 7 are carried out in the state in which the tray stages for carrying out the operations are rotationally transferred into the standby tray placement position P1 as described above, the tray stages 16 and 18 are prevented from projectingly moving outwardly of the apparatus end portions even when the tray stages 16 and 18 are moved by the X-axis direction stage moving unit 22 and the Y-axis direction stage moving unit 21, respectively.

On the other hand, when the tray 7 placed in the component feeding position P0 suffers component depletion in the second stacking tray supply unit 102, the switchover operation of the tray 7 is carried out by rotationally transferring the tray stages 36 and 38 on the concentric circle by the rotational transfer unit 40 in a procedure similar to the procedure in the first stacking tray supply unit 101 and positioning the tray stage 38, which has been positioned in the standby tray placement position P5, into the feeding tray placement position P6, i.e., the component feeding position P0 (step S31). Subsequently, the component feeding from the replaced tray 7 is started, and the component mounting on the gate side terminal portion is restarted (step S32).

Subsequently, when the component mounting on the gate side terminal portion is ended (step S33), the tray stage 38 positioned in the component feeding position P0 retreats from the component feeding position P0 (step S34). After the retreating motion, the operations of collecting the empty tray 7 and supplying a new tray 7 are carried out in the second stacking tray supply unit 102 in a procedure similar to the procedure in the case of the first stacking tray supply unit 101 described above (step S37). Moreover, it is determined whether the manufacturing is to be ended, i.e., whether the component mounting on the next LCD panel board 1 is to be carried out in the component mounting apparatus 100 (step S35). The operation procedures subsequent to the step S21 are successively carried out when it is determined that the component mounting is to be carried out, or the component mounting is ended when it is determined that the manufacturing is to be ended.

In the state in which the tray stages 16 and 18 of the first stacking tray supply unit 101 are positioned in the component feeding position P0, the movement positions of the tray stages are controlled by the control unit 10 so that the path of the rotational transfer for switchover between the tray stages 16 and 18 and the path of the rotational transfer for switchover between the tray stages 36 and 38 of the second stacking tray supply unit 102 do not interfere with each other. Likewise, in the state in which the tray stages 36 and 38 of the second stacking tray supply unit 102 are positioned in the component feeding position P0, the movement positions of the tray stages are controlled by the control unit 10 so that the path of the rotational transfer for switchover between the tray stages 36 and 38 and the path of the rotational transfer for switchover between the tray stages 16 and 18 in the first stacking tray supply unit 101 do not interfere with each other. Therefore, the collecting operation of the tray 7 and the supplying operation of a new tray 7 in one stacking tray supply unit can be carried out independently of the component feeding operation in the other stacking tray supply unit.

When the component mounting on the next LCD panel board 1 is carried out in the component mounting apparatus 100, the collecting and supplying operations of the second stacking tray supply unit 102 in step S37 can be carried out in parallel with steps S21 through S27.

Moreover, the detection of the fact that the tray 7 placed in the component feeding position P0 is in the empty state (steps S23, S30) can be determined by, for example, counting the number of components picked up from the inside of the tray 7 by the inverting head unit 8 and comparing the count with the number of components that have preparatorily been stored in the tray 7 by the control unit 10. Moreover, it can be determined that the tray 7 is in the empty state also when a suction error occurs in picking up a component by suction and thereafter the suction errors occur continuously prescribed times in picking up subsequent components by suction or in a similar case. Otherwise, the determination can also be made by recognizing the number of remaining components stored in the tray 7 by the recognition camera 8a installed above the component feeding position P0. In the first embodiment, the control unit 10 or the recognition camera 8a serves as one example of the empty tray detecting unit.

Although the case where the components are fed from the tray 7 placed in the shared component feeding position P0 used in common has been described above, it is also possible to carry out the component feeding from the trays 7 placed in the feeding tray placement positions P2 and P6 in the respective stacking tray supply units 101 and 102 instead of the above case without using the shared position. However, by using one shared component feeding position P0 used in common by the two stacking tray supply units 101 and 102, the moving range of the inverting head unit 8 can be reduced, and the component mounting apparatus can be reduced in size.

Moreover, in a case where the tray 7 or the components stored in the tray 7 have orientations in arrangement, the trays 7 should preferably be placed on the respective tray stages so that the postures and directions of the trays 7 become consistently identical in a state in which the tray stages are rotationally transferred and positioned in the feeding tray placement positions P2 and P6 as shown in FIG. 6B. From this point of view, the trays 7 of the same kind placed on the tray stages 16 and 18 are arranged so as to have postures of point symmetry with respect to the center of rotation as a reference in FIG. 6B.

Moreover, the postures and directions of the trays 7 received in the stockers 12 and 14 need to be determined considering the arrangement positions P1, P2 and so on in which the tray stages 16 and 18 to be used are positioned to carry out the collection and supplying operations of the trays 7. For example, in the case where the delivery of the trays 7 are performed between the tray stages 16 and 18 positioned in the standby tray placement position P1 and the respective stockers 12 and 14 as described above, the postures of the trays 7 received in the stockers 12 and 14 are determined so as to agree with the placement postures thereof on the tray stage positioned in the standby tray placement position P1. The arrangement positions of the tray stages 16 and 18 that perform delivery of the trays 7 between them and the respective stockers 12 and 14 are allowed to have other various adoptable modes, and an optimum mode can be selected from the viewpoint of, for example, compacting the apparatus space, shortening the replacing time and so on, to which importance is attached.

Figure 7:
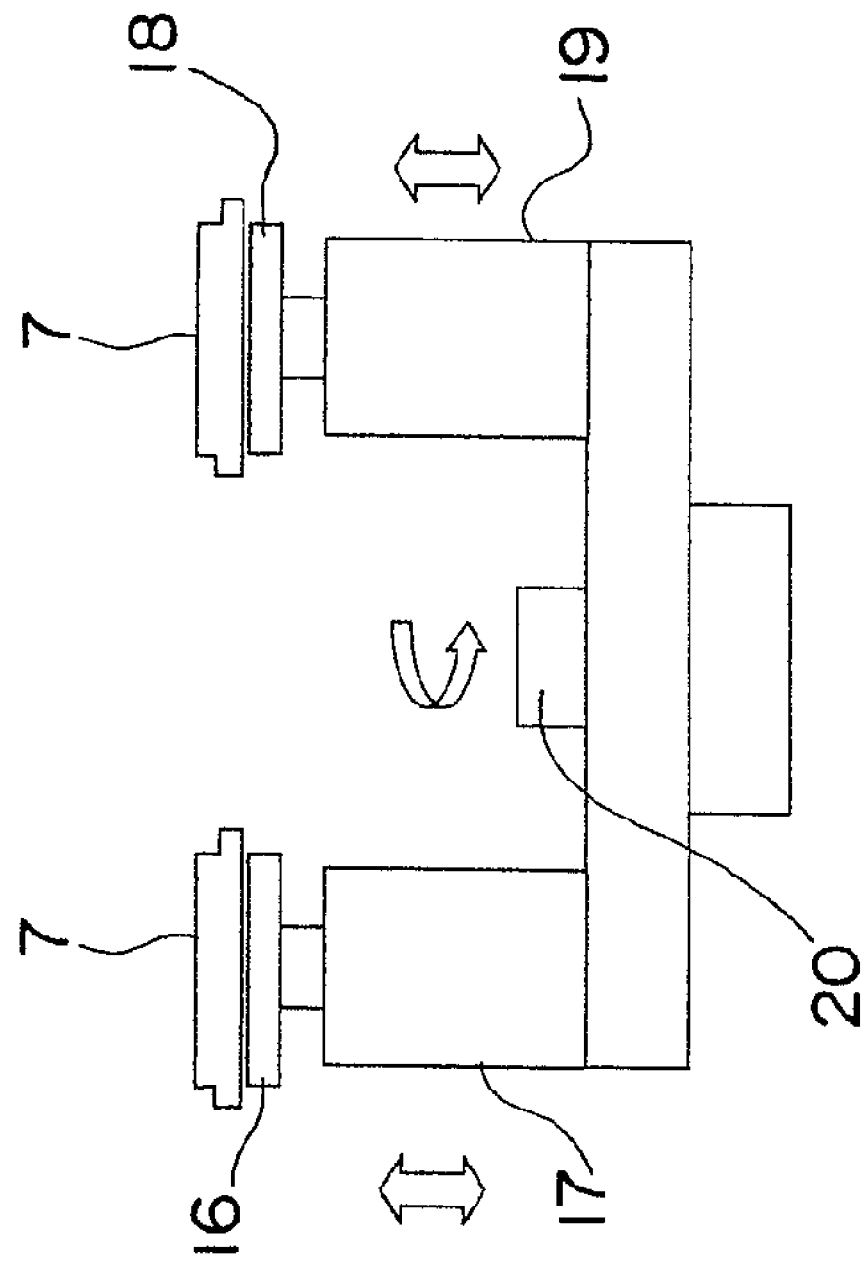
FIG. 7 is a schematic view showing the structures of a tray stage and a rotational transfer unit of the first embodiment.
Figure 8:
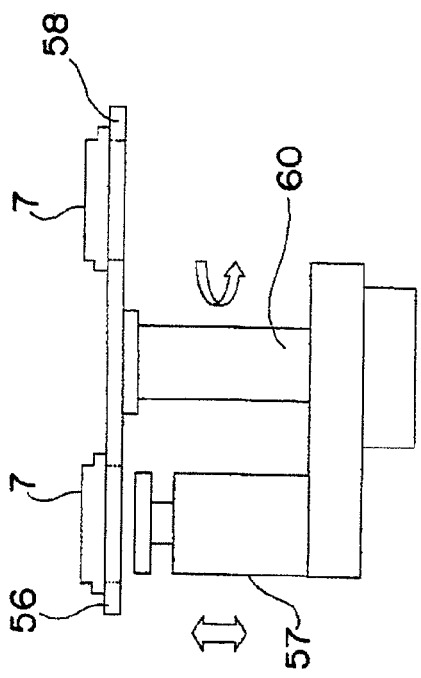
FIG. 8 is a schematic view showing the structures of a tray stage and a rotational transfer unit according to a modification example of the first embodiment.

Moreover, the case where the structure in which the stage lifts 17 and 19 are provided individually for the respective tray stages 16 and 18, and the tray stages 16 and 18 are integrally rotationally transferred with the stage lifts 17 and 19 by the rotational transfer unit 20 is adopted as shown in the schematic explanatory view of FIG. 7 has been described above. However, structures other than the above structure can also be adopted. For example, as shown in FIG. 8, it is also possible to adopt a structure such that a stage lift 57 is singly provided, and tray stages 56 and 58 are rotationally transferred by a rotational transfer unit 60 and selectively positioned above the stage lift 57. The above structure can obtain the advantages that the number of lifts to be provided can be reduced, and measures against breakage due to oscillation, damages of air piping and so on can be eliminated.

Moreover, although the case where the components are picked up from the tray 7 placed in the component feeding position P0 by the inverting head unit 8 by moving the inverting head unit 8 in the X-axis direction and the Y-axis direction by the inverting head moving unit 9 has been described above, the invention is not limited only to such a case. Instead of the above case, it is also possible to provide, for example, a structure in which the inverting head moving unit 9 moves the inverting head unit 8 only in either one direction of the X-axis direction and the Y-axis direction, and the movement of the tray 7 in the other direction relative to the inverting head unit 8 is achieved by the movement of the tray stage by the X-axis direction stage moving unit 22 or the Y-axis direction stage moving unit 21. However, it is preferable to adopt a structure such that the X-Y transfer of the inverting head unit 8 for correcting the component position and picking up the component is carried out in a state in which the tray 7 is fixed from the viewpoint of the possible occurrence of the positional misalignment of components after the positions of components on the tray 7 are recognized (or imaged) by the recognition camera 8a.

According to the component mounting apparatus 100 of the first embodiment, the stacking tray supply unit, which has two tray stages that are arranged on a concentric circle and able to be switched over in position by rotational transfer, is provided. With this arrangement, even if the tray placed on one tray stage suffers component depletion, the tray can easily be promptly replaced by the tray placed on the other tray stage by the rotational transfer. Therefore, the interruption time of component feeding can be made extremely short. That is, losses in the machine tact of component feeding attributed to the tray entering the empty state can be reduced, and efficient and substantially continuous component feeding can be achieved with a comparatively simple structure.

Moreover, the component mounting apparatus 100 has the two stacking tray supply units 101 and 102 structured as above, and the rotational transfer for switchover between the tray stages positioned in the component feeding position in one stacking tray supply unit and the rotational transfer for switchover between the tray stages in the other stacking tray supply unit can be concurrently performed without mutual interference. With this arrangement, while the component feeding for the component mounting is continuously carried out in one tray supply unit, the empty tray collecting operation and the new tray supplying operation can be carried out in the other tray supply unit. Therefore, the component feeding can be carried out more efficiently.

The Second Embodiment

Figure 9:
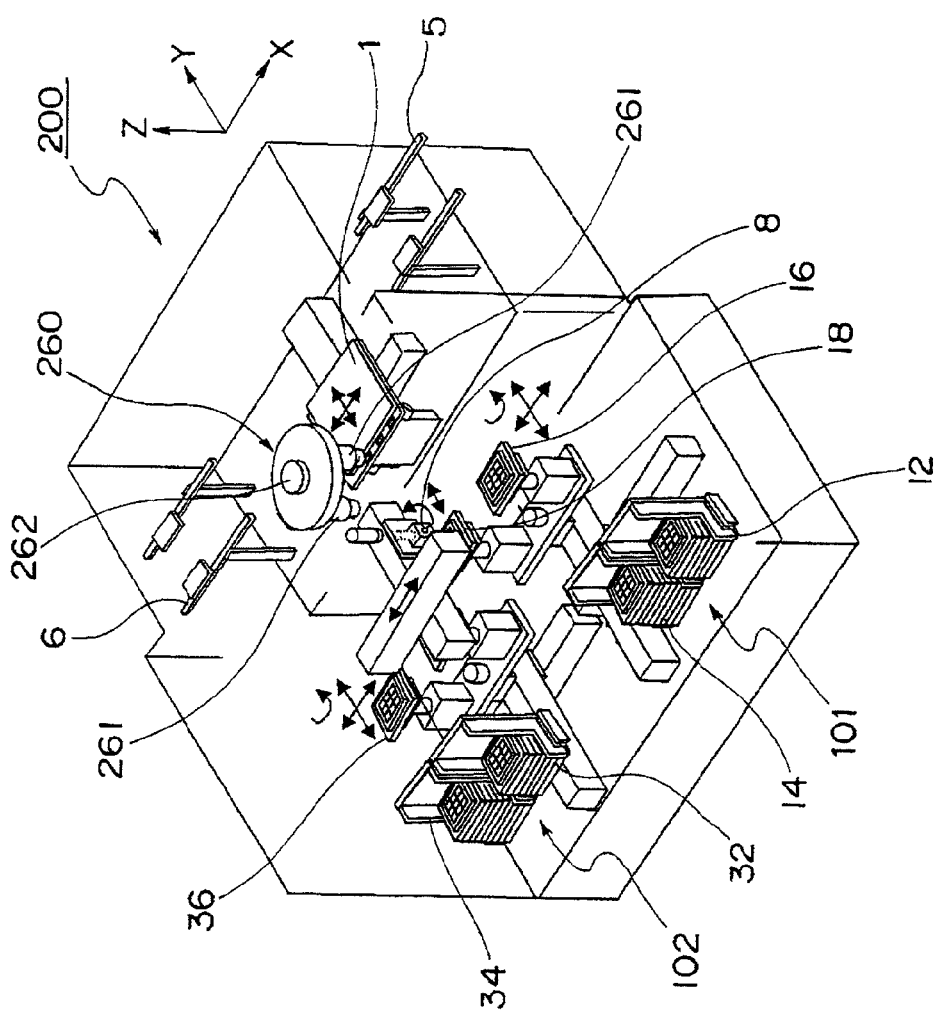
FIG. 9 is a schematic structural view of a component mounting apparatus according to a second embodiment of the invention.
Figure 10:
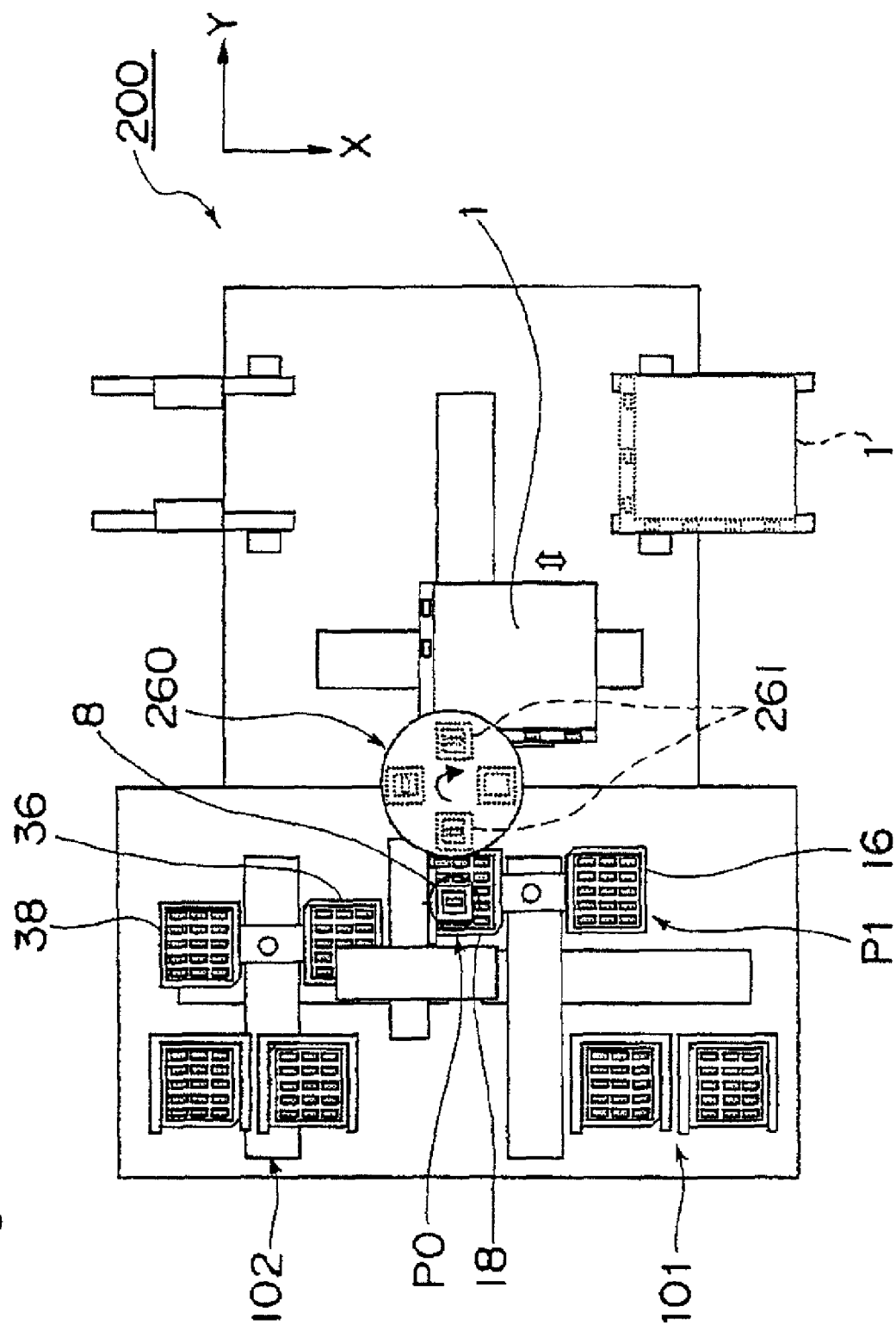
FIG. 10 is a schematic plan view of the component mounting apparatus of FIG. 9.
Figure 11:
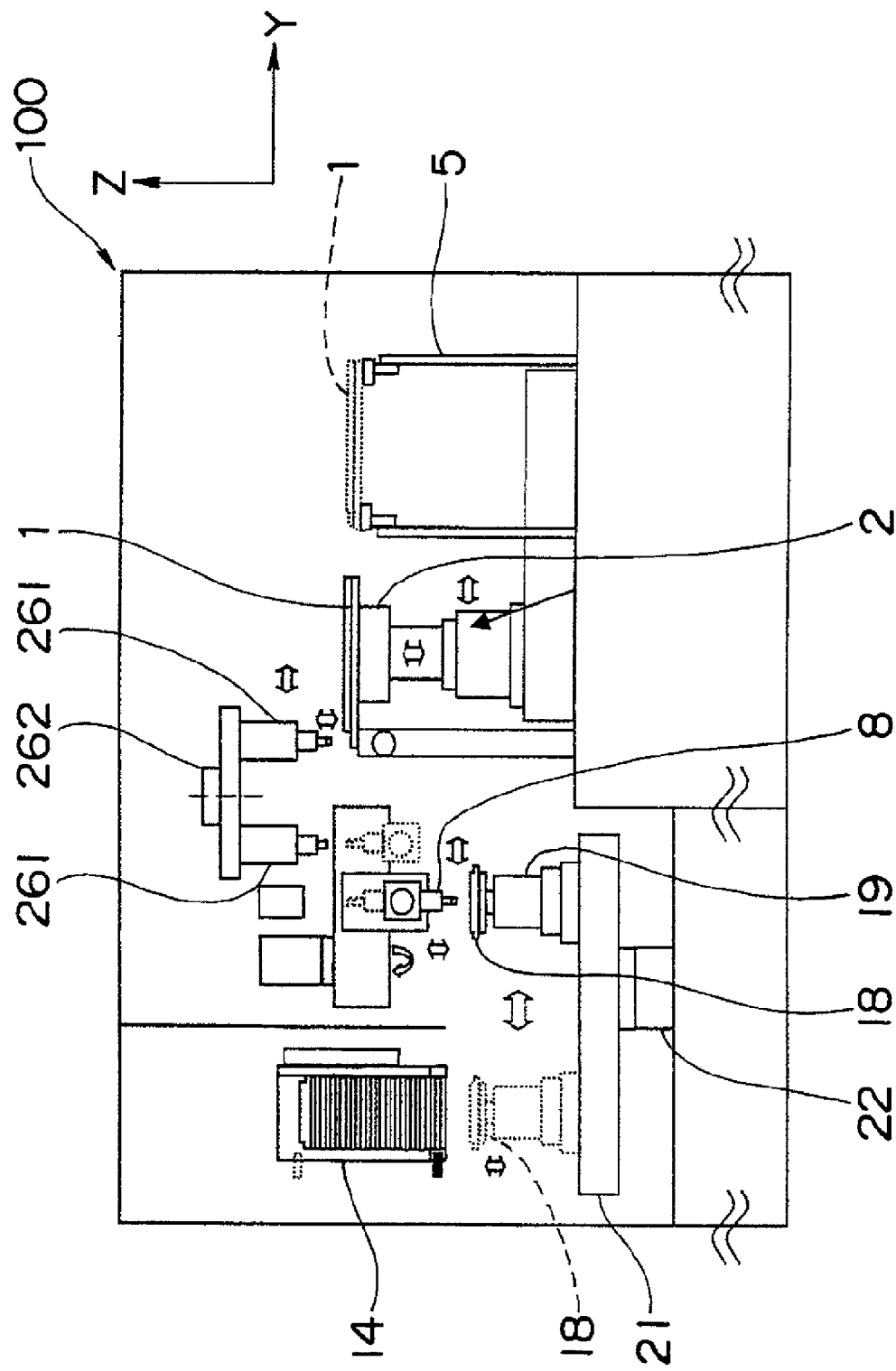
FIG. 11 is a schematic side view of the component mounting apparatus of FIG. 9.

The invention is not limited to the above embodiment but allowed to be implemented in various modes. For example, a schematic structural view of a component mounting apparatus 200 according to the second embodiment of the invention is shown in FIG. 9. A schematic plan view and a schematic side view of the apparatus are shown in FIG. 10 and FIG. 11, respectively. In the component mounting apparatus 200 of the second embodiment shown in FIGS. 9 through 11, the same constituent members (devices) as those of the component mounting apparatus 100 of the first embodiment are denoted by the same reference numerals, and no description is provided therefor.

As shown in FIGS. 9 through 11, the component mounting apparatus 200 has a structure differing from that of the first embodiment in the point that a rotary system head unit is adopted as a temporary mounting head unit 260 although it has a structure similar to that of the first embodiment in the point that the first stacking tray supply unit 101 and the second stacking tray supply unit 102 are provided.

The temporary mounting head unit 260 has, for example, four suction nozzles 261 arranged on a concentric circle, and the suction nozzles 261 are rotationally transferred by a rotary drive device 262 on the concentric circle. For example, as shown in FIG. 10, the suction nozzle 261 positioned in the rotationally transferred position on the illustrated left-hand side receives the component held by the inverting head unit 8 and carries out component mounting on the LCD panel board 1 in a state in which it is subsequently rotationally transferred and positioned in the rotationally transferred position on the illustrated right-hand side.

By adopting the rotary system head unit as described above, an example of operation from the receiving of the component from the inverting head unit 8 to the component mounting on the panel board 1 can efficiently be carried out while mutually overlapping the operations by the plurality of suction nozzles 261. Therefore, more efficient component mounting can be achieved by combining the components fed from the tray 7 with the efficient component feeding.

The Third Embodiment

Figure 12:
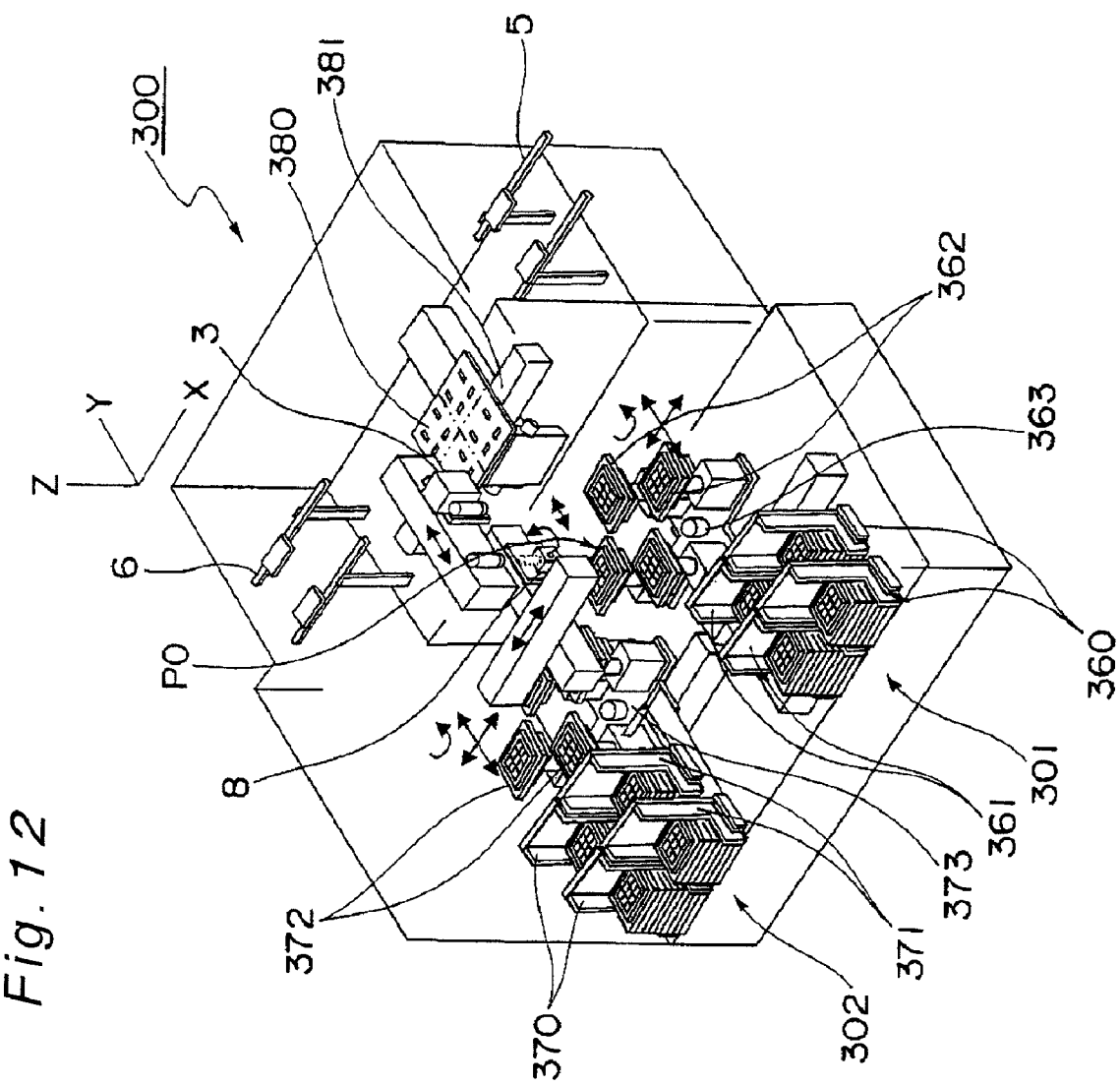
FIG. 12 is a schematic structural view of a component mounting apparatus according to a third embodiment of the invention.

Next, a schematic structural view showing the schematic structure of a component mounting apparatus 300 according to the third embodiment of the invention is shown in FIG. 12.

As shown in FIG. 12, the component mounting apparatus 300 of the third embodiment has a structure differing from that of the first embodiment in the point that two supply side stockers and two collection side stockers are provided for each of the stacking tray supply units, and four tray stages are provided rotationally transferably on a concentric circle.

In concrete, as shown in FIG. 12, a first stacking tray supply unit 301 has two supply side stockers 360, two collection side stockers 361, four tray stages 362 arranged at equal intervals on a concentric circle, and a tray transfer device 363 for X-Y transfer and rotational transfer on a concentric circle of the tray stages 362. Moreover, a second stacking tray supply unit 302 has a similar structure and has two supply side stockers 370, two collection side stockers 371, four tray stages 372 arranged at equal intervals on a concentric circle, and a tray transfer device 373.

Moreover, the component mounting apparatus 300 is the apparatus that carries out mounting operations of a plurality of components onto a circuit board 380, and a board placement stage 381 is able to place and retain the circuit board 380. A variety of types of components are generally mounted onto such a circuit board 380. Therefore, adopting a structure such that the types of the components stored in the tray 7 evaluated in each of the supply side stockers vary every stocker makes it possible to cope with supplying a plurality of types of components.

In the component mounting apparatus 300 structured as above, for example, trays 7 that store components of the same type (components of a first type) are placed on two tray stages 362 of the four tray stages 362, and trays 7 that store components of another type (components of a second type) are placed on the other two tray stages 362 in the first stacking tray supply unit 301. Moreover, trays 7 that store components of the same type (components of the first type) are placed on two tray stages 372 of the four tray stages 372, and trays 7 that store components of another type (components of the second type) are placed on the other two tray stages 372 likewise in the second stacking tray supply unit 302.

By thus placing the trays 7 that store components of the same type on the two tray stages of the four tray stages 362, 372 in the stacking tray supply units 301 and 302, respectively, efficient and substantially continuous component feeding can be achieved while reducing the interruption time of component feeding by placing the other tray 7 that stores components of the same type in the component feeding position P0 by the rotational transfer on a concentric circle by the tray transfer devices 363, 373 even when component depletion occurs in the tray 7.

Moreover, by positioning the desired tray 7 in the component feeding position P0 by rotational transfer of the four trays 7 placed on the concentric circle, feeding of components of different types can be carried out, and component mounting onto the circuit board 380 on which components of various types are to be mounted can be achieved.

Among the four tray stages arranged on the concentric circle, one is positioned in the feeding tray placement position, and the other three are positioned in the standby tray placement positions.

Moreover, the case where the trays that store components of mutually different types are received in the respective supply stockers has been described above. However, it may be a case where trays for feeding components of the same type are received in accordance with the specifications of the type of the circuit board and the objects to be mounted are of LCD panel boards.

The Fourth Embodiment

Figure 13:
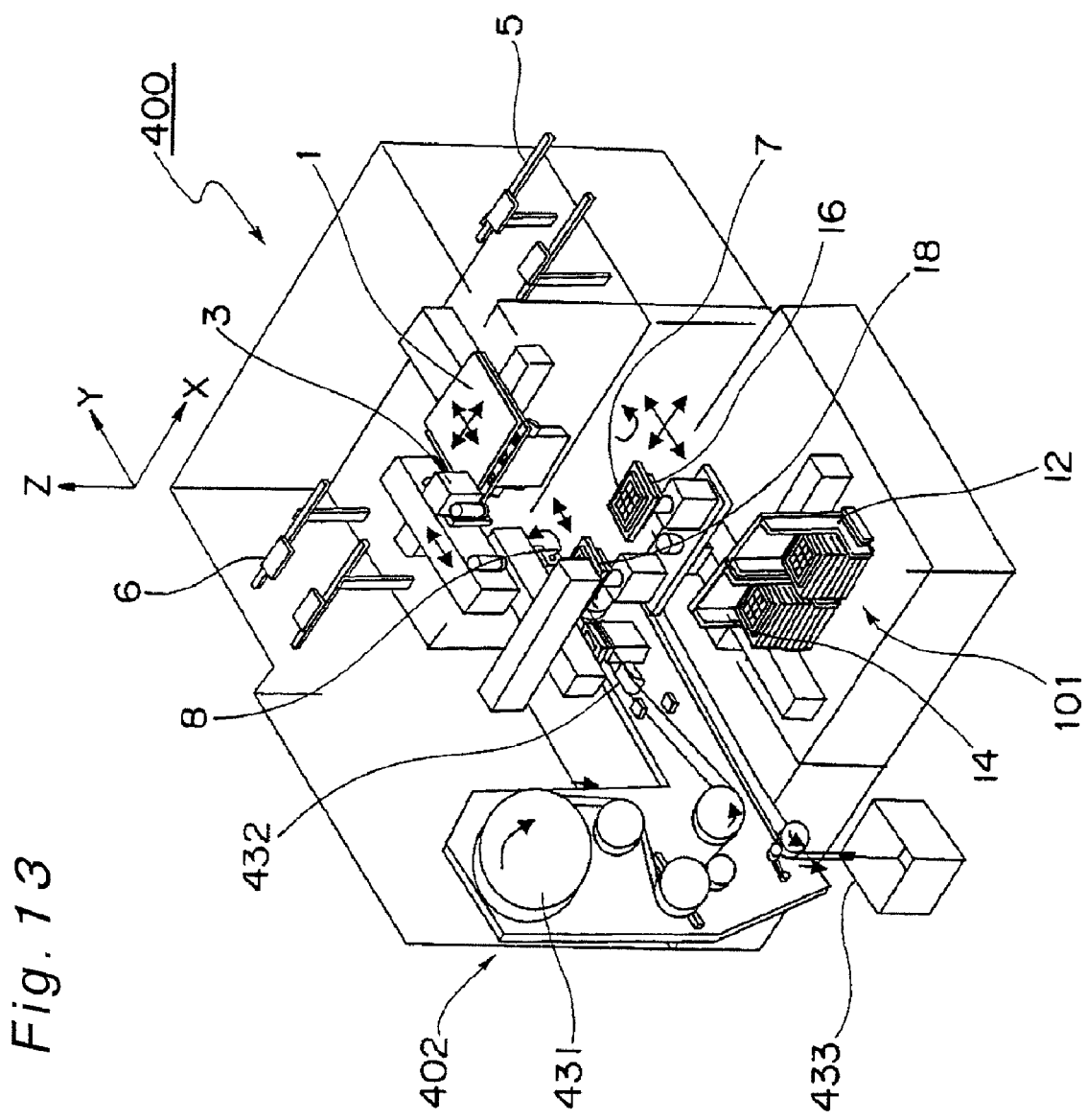
FIG. 13 is a schematic structural view of a component mounting apparatus according to a fourth embodiment of the invention.

Next, a schematic structural view showing the schematic structure of a component mounting apparatus 400 according to the fourth embodiment of the invention is shown in FIG. 13. As shown in FIG. 13, the component mounting apparatus 400 of the fourth embodiment has a structure differing from that of the component mounting apparatus of the first embodiment in the point that the stacking tray supply unit 101 and a TCP feeder unit 402 for feeding TCP (Tape Carrier Package) components are provided as components of one example of the component feeding unit that has a component feeding mode different from that of the stacking tray supply unit. Only the difference of the structure is described below.

As shown in FIG. 13, the TCP feeder unit 402 has a TCP cassette unit 431 for receiving a tape-shaped TCP feedably wound around in a reel shape, a TCP punching unit 432 for punching out the tape-shaped TCP fed from the TCP cassette unit 431 into individual pieces and feeding the same as components (TCP components), and a tape collecting unit 433 for collecting the tape member from which the components are punched out.

Generally, components such as IC chips, which are fed from the tray 7 in terms of feeding style, are mounted onto the source side terminal portion, while TCP components such as flexible boards besides IC chips are mounted onto the gate side terminal portion at the LCD panel board 1. Although the components to be mounted onto the source side terminal portion are fed from the tray 7 in terms of feeding style, it may be a case where components are fed in a feeding style other than the tray style as in the case of the gate side terminal portion in place of the above case. The component mounting apparatus 400 of the fourth embodiment becomes able to cope with the mounting of components fed in a feeding style other than the tray style of IC chips and the like by combining the stacking tray supply unit 101 with the TCP feeder unit 402.

Moreover, in the apparatus structure as described above, switchover between the two tray stages 16 and 18 by rotational transfer in the stacking tray supply unit 101 is able to promptly cope with the component depletion in the tray 7 and to feed TCP components by the TCP feeder unit 402, therefore allowing efficient component feeding to be achieved.

Moreover, if an arrangement configuration such that the TCP component feeding position by the TCP feeder unit 402 and the component feeding position by the tray 7 are brought as close as possible to each other is adopted, the moving range of the inverting head 8 is also reduced, and efficient component feeding can be carried out.

FIG. 13 shows the case where the reel part of the TCP cassette unit 431 or the like of the TCP feeder unit 402 is arranged on the stacking tray supply unit 101 side (arranged facing the inside of the component mounting apparatus) as an example. However, if an arrangement configuration such that the TCP feeder unit 402 and the stacking tray supply unit 101 are interchanged in position is adopted in place of the above case, the reel part of the TCP feeder unit 402 can be arranged facing the outside of the component mounting apparatus, and therefore, the replacement or maintenance performance of the reel component can be made satisfactory.

The Fifth Embodiment

Figure 14:
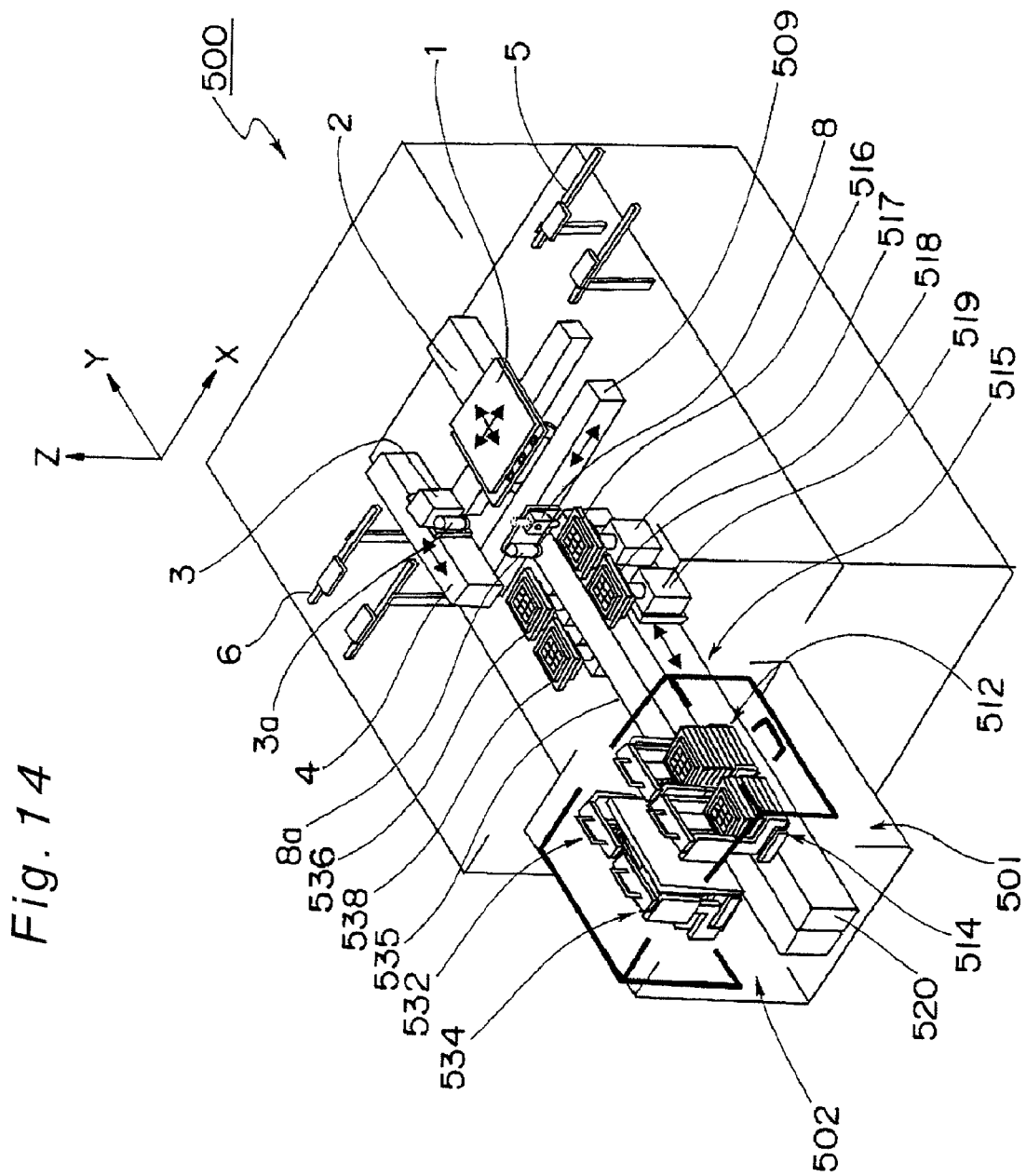
FIG. 14 is a schematic structural view of a component mounting apparatus according to a fifth embodiment of the invention.
Figure 15:
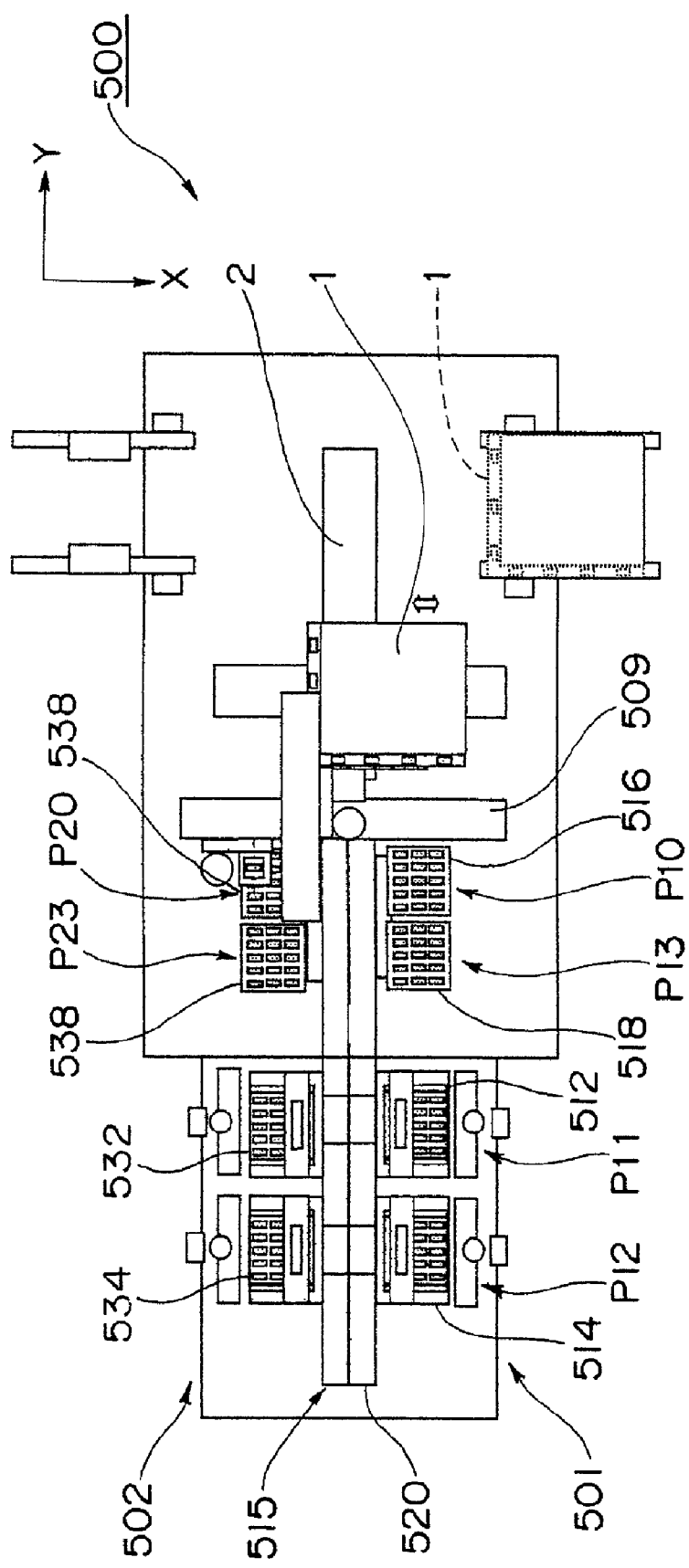
FIG. 15 is a schematic plan view of the component mounting apparatus of FIG. 14.

A schematic structural view showing the schematic structure of a component mounting apparatus 500 according to the fifth embodiment of the invention is shown in FIG. 14. Moreover, a schematic plan view of the component mounting apparatus 500 is shown in FIG. 15, and a schematic side view of the apparatus is shown in FIG. 16. In the component mounting apparatus 500 shown in FIGS. 14 through 16, the same constituent members (devices) as those of the component mounting apparatus 100 of the first embodiment are denoted by the same reference numerals, and no description is provided therefor.

As shown in FIGS. 14 through 16, the component mounting apparatus 500 has a structure differing from that of the component mounting apparatus of the first embodiment in the point that the tray stage transfer structures of the tray supply units are varied although it is similar to the apparatus of the first embodiment in the point that the two tray supply units of a first stacking tray supply unit 501 and a second stacking tray supply unit 502 are provided. Since the first stacking tray supply unit 501 and the second stacking tray supply unit 502 have same structures, only the structure of the first stacking tray supply unit 501 is mainly described below.

As shown in FIGS. 14 through 16, the first stacking tray supply unit 501 has a supply side stocker 512 for receiving in a stacked state a plurality of trays in which a plurality of components are stored, a collection side stocker 514 for receiving in a stacked state a plurality of empty trays that have undergone component feeding, and a tray transfer device 515 for receiving the tray supplied from the supply side stocker 512, transferring the tray into a component feeding position P10, transferring the empty tray that has undergone component feeding into the component feeding position P10 and collecting the tray to the collection side stocker.

The tray transfer device 515 has two tray stages 516 and 518 on which the trays 7 are placed and retained, stage lifts 517 and 519 for individually moving up and down the tray stages 516 and 518, and a stage moving unit 520 for integrally moving the tray stages 516 and 518 and the lifts 517 and 519 in the illustrated Y-axis direction. The stage moving unit 520 integrally moves the tray stages 516 and 518 so as to position the tray stages 516 and 518 in the positions of the component feeding position P10 positioned below the moving range of the inverting head unit 8, a tray supplying position P11 that is a position below the supply side stocker 512 and a tray collecting position P12 that is a position below the collection side stocker 514. Moreover, the stage moving unit 520 integrally moves the tray stages 516 and 518 along the Y-axis direction so as to position either one of the two tray stages 516 and 518 selectively into the component feeding position P10 and position the other into a standby tray placement position P13. These four positions P10, P11, P12 and P13 are the positions arranged in a line along the Y-axis direction. The stage moving unit 520, which moves the tray stages 516 and 518 along the Y-axis direction, is constructed of, for example, a ballscrew mechanism or the like. The stage lifts 517 and 519 move up and down the tray stages 516 and 518 between a stage movement height position that is a height position where the tray stages 516 and 518 are prevented from coming in contact with the respective stockers 512 and 514 when the tray stages 516 and 518 are moved by the stage moving unit 520 and a tray delivery height position that is a height position where the delivery (supply or collection) of the tray 7 is performed with the respective stockers 512 and 514.

Moreover, the second stacking tray supply unit 502 has a structure similar to that of the first stacking tray supply unit 501 structured as above and has a supply side stocker 532, a collection side stocker 534, two tray stages 536 and 538 and a tray transfer device 535.

Moreover, the structure to carry out the component mounting in the component mounting apparatus 500 is generally the same as that of the component mounting apparatus 100 of the first embodiment, and the structure differs only in the point that the moving direction of the inverting head unit 8 by an inverting head moving unit 509 is in the X-axis direction. The positioning of the tray 7 positioned in the component feeding position P10 and the inverting head unit 8 is performed by a stage moving unit 518 in the Y-axis direction and by an inverting head moving unit 509 in the X-axis direction.

A method for supplying the tray 7 in the component mounting apparatus 500 structured as above is described next with reference to FIGS. 17A and 18A that are schematic plan views showing the positional relations of the first stacking tray supply unit 501 and the inverting head unit 8 and FIGS. 17B and 18B that are schematic side views corresponding to the figures, respectively.

Figure 17A:
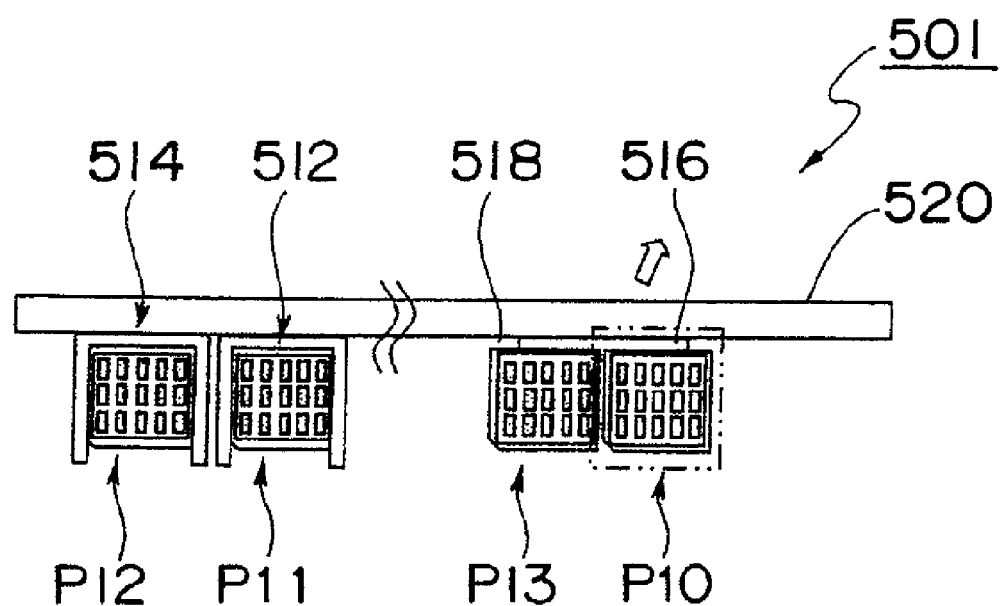
FIG. 17A is a schematic plan view showing tray supplying operation in the component mounting apparatus of the fifth embodiment.
Figure 17B:
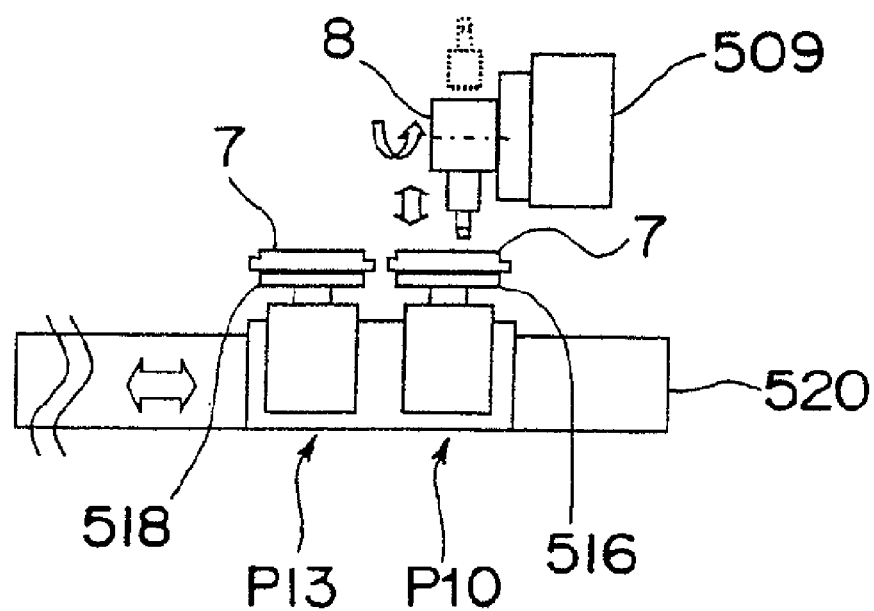
FIG. 17B is a schematic side view corresponding to the schematic plan view of the tray supplying operation of FIG. 17A.

First of all, in the first stacking tray supply unit 501, as shown in FIGS. 17A and 17B, the tray stages 516 and 518 on which the trays 7 are placed are integrally moved in the Y-axis direction by the stage moving unit 520, and the tray stage 516 is positioned into the component feeding position P10. In the state in which the tray stage 516 is positioned in the component feeding position P10, the positional alignment of one component stored in the tray 7 with the inverting head unit 8 is performed by the inverting head moving unit 509 and the stage moving unit 520, so that the components are successively picked up. The component picked up by the inverting head unit 8 is delivered to the temporary mounting head unit 3 and mounted onto the source side terminal portion of the LCD panel board 1.

Figure 18A:
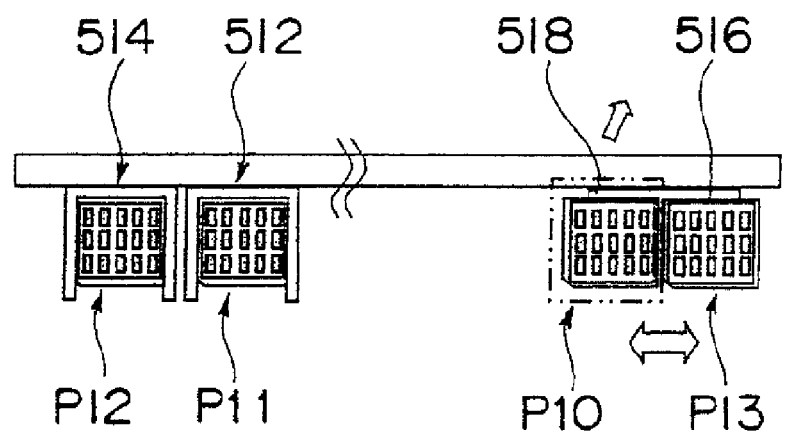
FIG. 18A is a schematic plan view showing the tray supplying operation in the component mounting apparatus of the fifth embodiment, in a state in which the operation of replacing the tray that suffers component depletion is carried out.
Figure 18B:
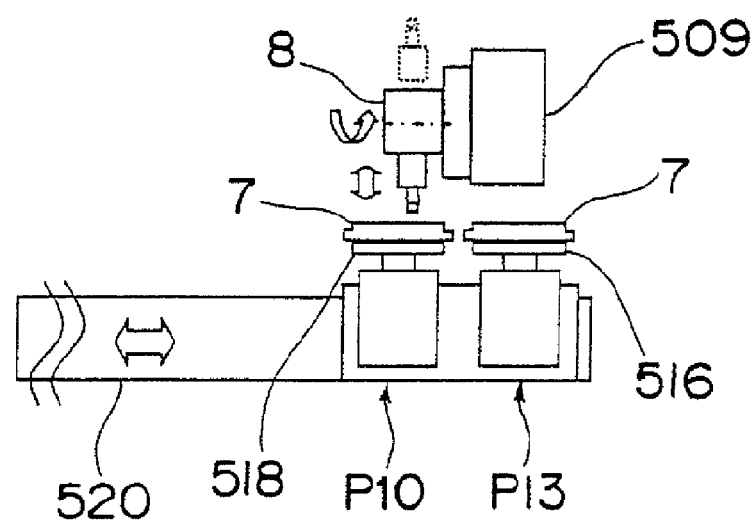
FIG. 18B is a schematic side view corresponding to the schematic plan view of the tray supplying operation of FIG. 18A.

When the components stored in the tray 7 placed on the tray stage 516 are depleted in due course, i.e., the component depletion state occurs, the tray stages 516 and 518 are integrally moved rightward in the illustrated Y-axis direction by the stage moving unit 520 as shown in FIGS. 18A and 18B, and the tray stage 518 that has been positioned in the standby tray placement position P13 is positioned into the component feeding position P10. Subsequently, component feeding from the tray 7 placed on the tray stage 518 positioned in the component feeding position P10 to the inverting head unit 8 is carried out.

When the component mounting onto the source side terminal portion ends, the inverting head unit 8 is moved to a location above a component feeding position P20 in the second stacking tray supply unit 502 by the inverting head moving unit 509. Subsequently, component feeding from the tray 7 placed on the tray stage 536 positioned in the component feeding position P20 is carried out in the second stacking tray supply unit 502, so that the component mounting onto the gate side terminal portion of the LCD panel board 1 is carried out.

On the other hand, in the first stacking tray supply unit 501, the tray stages 516 and 518 are moved by the stage moving unit 520, and the tray stage 516 on which the empty tray 7 is placed is positioned into the tray collecting position P12 to collect the empty tray 7 into the collection side stocker 514. Subsequently, the tray stage 516 is positioned in the tray supplying position P11, and a new tray 7 is supplied from the supply side stocker 512 and placed. While the collecting and supplying of the trays 7 are being thus carried out in the first stacking tray supply unit 501, the component feeding for component mounting onto the gate side terminal portion is continuously carried out in the second stacking tray supply unit 502.

When the tray 7 positioned in the component feeding position P20 suffers component depletion in the second stacking tray supply unit 502 shown in FIG. 15, continuous component feeding can be carried out by positioning the tray stage 538 positioned in the standby tray placement position P23 into the component feeding position P20 in a procedure similar to the operation procedure in the first stacking tray supply unit 501.

According to the component mounting apparatus 500 of the fifth embodiment, even when, for example, a structure such that the two tray stages provided at the respective stacking tray supply units are not rotationally transferred but displaced parallel in one direction, efficient component feeding can be achieved by reducing the waste of time caused by the component depletion of the tray.

Moreover, by virtue of the provision of the two stacking tray supply units, it is possible to carry out the empty tray collecting operation and the new tray supplying operation in the other stacking tray supply unit while the component feeding is carried out in one stacking tray supply unit, and efficient operation can be achieved.

Moreover, by adopting the structure such that the tray stages are moved linearly in, for example, the Y-axis direction, the apparatus width can be made compact in the X-axis direction, and this provides an advantage also in the point of effective use of the space.

Although the structure such that the tray stages 516 and 518 are integrally moved by the stage moving unit 520 has been described above, a structure such that the tray stages are individually moved in the Y-axis direction can also be adopted in place of the above structure. A supplying method (a modification example of the fifth embodiment) of the tray 7 in a first stacking tray supply unit 601 is described with reference to FIGS. 19A through 19E that are schematic side views showing the positional relations of the first stacking tray supply unit 601 and the inverting head 8 of the individually movable structure as above.

First of all, in the first stacking tray supply unit 601 as shown in FIG. 19A, tray stages 616 and 618 on which the trays 7 are placed are moved in the Y-axis direction by a stage moving unit 620, so that the tray stage 618 is positioned into the component feeding position P10, and the tray stage 616 is positioned into the standby tray placement position P13. Subsequently, in the state in which the tray stage 618 is positioned in the component feeding position P10, the components stored in the tray 7 are successively picked up by the inverting head unit 8 and mounted onto the source side terminal portion of the LCD panel board 1.

Figure 19B:
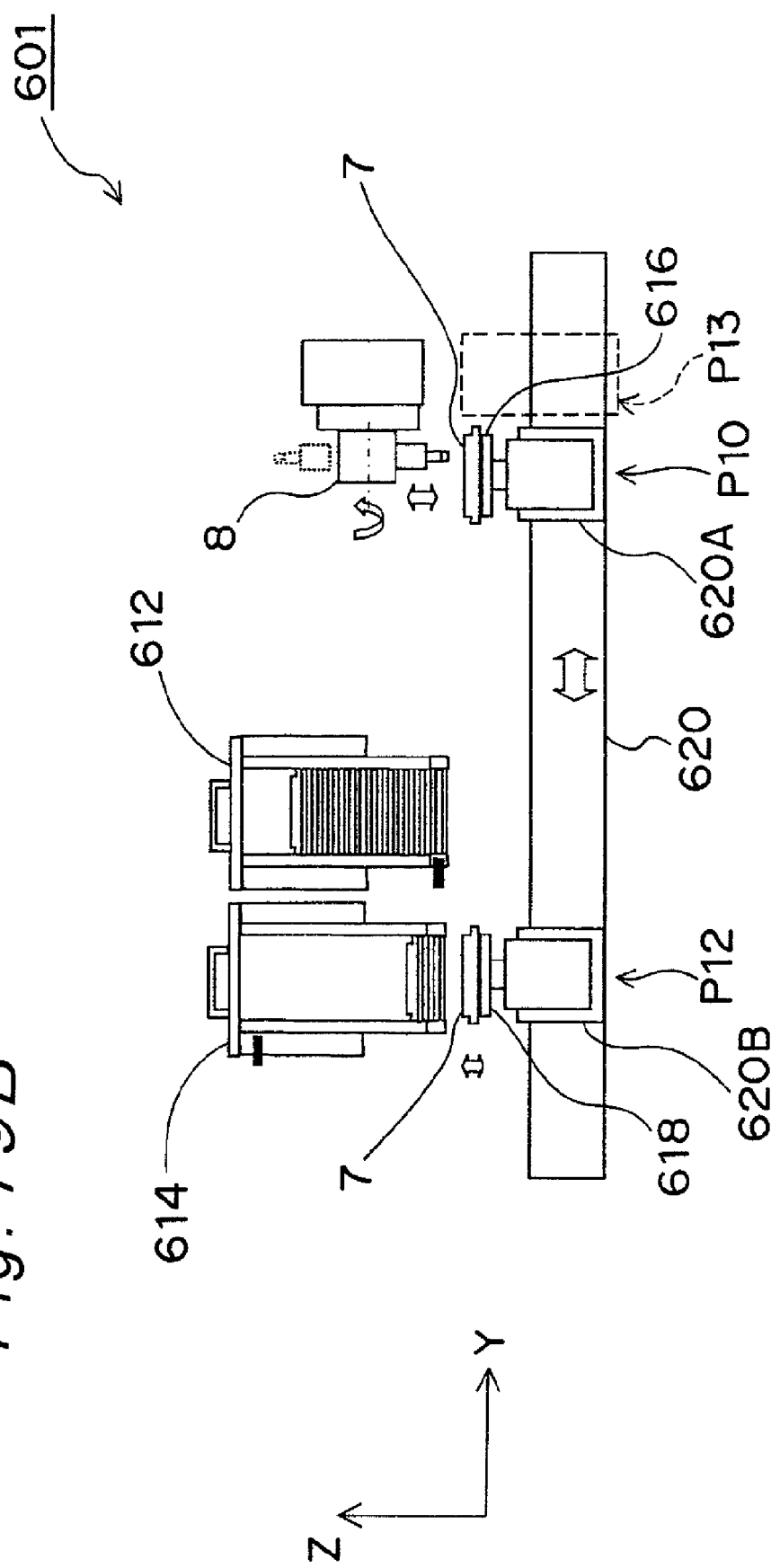
FIG. 19B is a schematic side view showing the tray supplying operation following FIG. 19A, in a state in which tray stage switchover operation is carried out and empty tray collecting operation is carried out.

When the tray 7 placed on the tray stage 618 enters the component depletion state, the tray stage 618 is moved leftward in the illustrated Y-axis direction by the stage moving unit 620 and positioned into the tray collecting position P12 as shown in FIG. 19B, and the empty tray 7 is collected to a collection side stocker 614. Further, the tray stage 616, which has been positioned in the standby tray placement position P13, is moved leftward in the illustrated Y-axis direction by the stage moving unit 620 and positioned into the component feed position P10. Subsequently, component feeding from the tray 7 placed on the tray stage 616 positioned in the component feeding position P10 to the inverting head unit 8 is carried out. That is, in the first stacking tray supply unit 601, the stage moving unit 620 can individually move the tray stages 616 and 618 instead of integrally moving the tray stages. In order to concretely achieve the mutually independent movement of the tray stages 616 and 618 as described above, the stage moving unit 620 has a first moving unit 620A (first stage moving unit) for moving the tray stage 616 and a second moving unit 620B (second stage moving unit) for moving the tray stage 618 independently of the first moving unit 620A.

Moreover, while the component feeding is being thus carried out by the tray stage 616, the tray stage 618, which has finished the collection of the empty tray 7, is moved into the tray supplying position P11 by the second moving unit 620B as shown in FIG. 19C, and a new tray 7 is supplied from the supply side stocker 612 and placed. Subsequently, the tray stage 618 on which the new tray 7 is placed is moved rightward in the illustrated Y-axis direction by the second moving unit 620B and positioned into the standby tray placement position P13 as shown in FIG. 19D.

Subsequently, when the tray 7 placed on the tray stage 616 enters the component depletion state, the tray stages 616 and 618 are moved rightward in the illustrated Y-axis direction by the stage moving unit 620 as shown in FIG. 19E, and the tray stage 616 on which the empty tray 7 is placed is positioned into the standby tray placement position P13. The tray stage 616 on which the new tray 7 is placed is positioned into the component feeding position P10, and the component feeding from the tray 7 on the tray stage 618 is continuously carried out.

In the structure in which the two tray stages 616 and 618 can individually move as described above, the collecting and supplying of the tray 7 can be carried out by moving one tray stage 618 independently of the other tray stage 616 while continuing the component feeding by switchover to the other tray stage 616 when component depletion occurs in the one tray stage 618. Therefore, even when the component depletion subsequently occurs in the tray stage 616, the component feeding can be continued by switchover to the tray stage 618 on which a new tray 7 is placed, and therefore, more efficient component feeding can be achieved. By making the first stacking tray supply unit 601 have a plurality of supply side stockers, the structure is capable of feeding components of various types of, for example, components for the source side terminal portion and components for the gate side terminal portion.

The Sixth Embodiment

Figure 20:
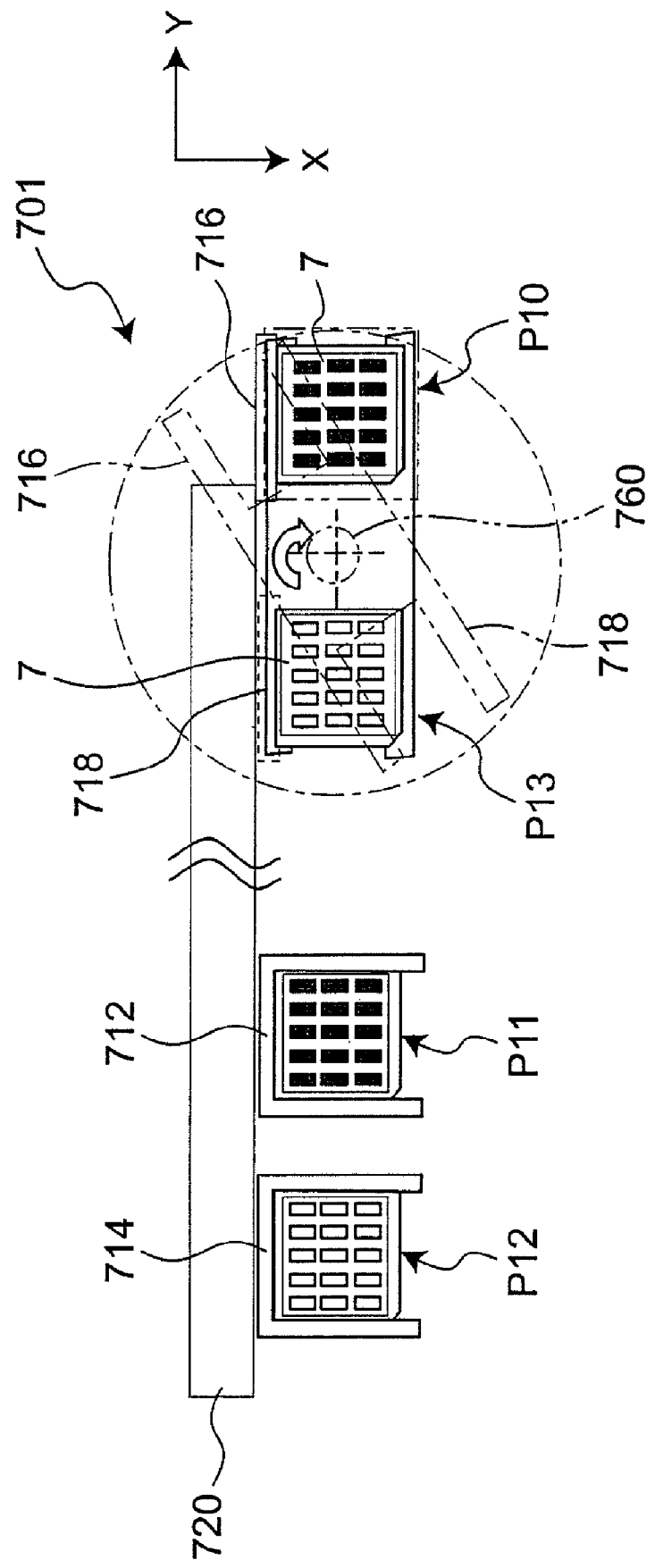
FIG. 20 is a schematic plan view of a stacking tray supply unit according to a sixth embodiment of the invention.
Figure 21:
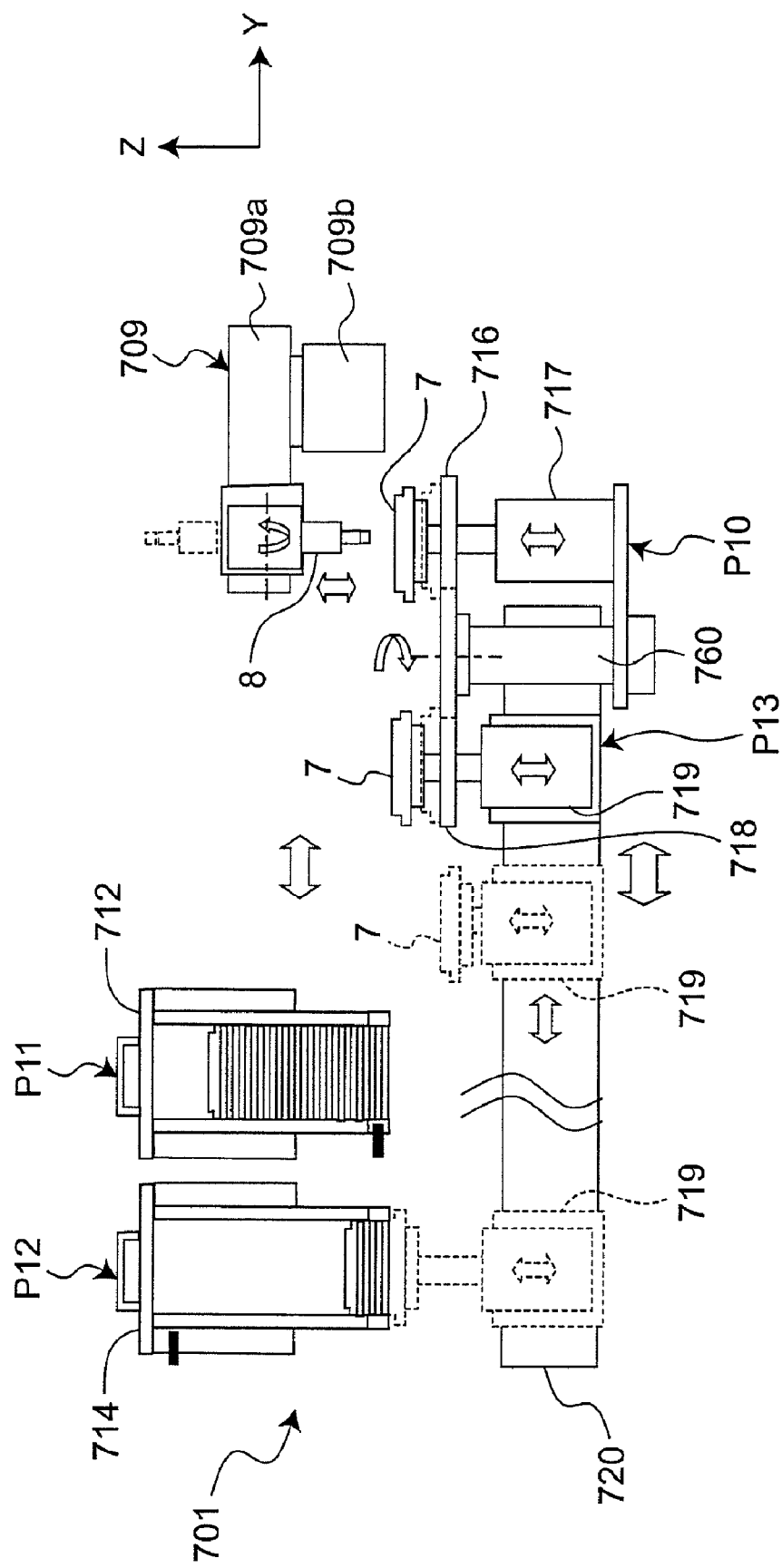
FIG. 21 is a schematic side view of the stacking tray supply unit of FIG. 20.
Figure 22:
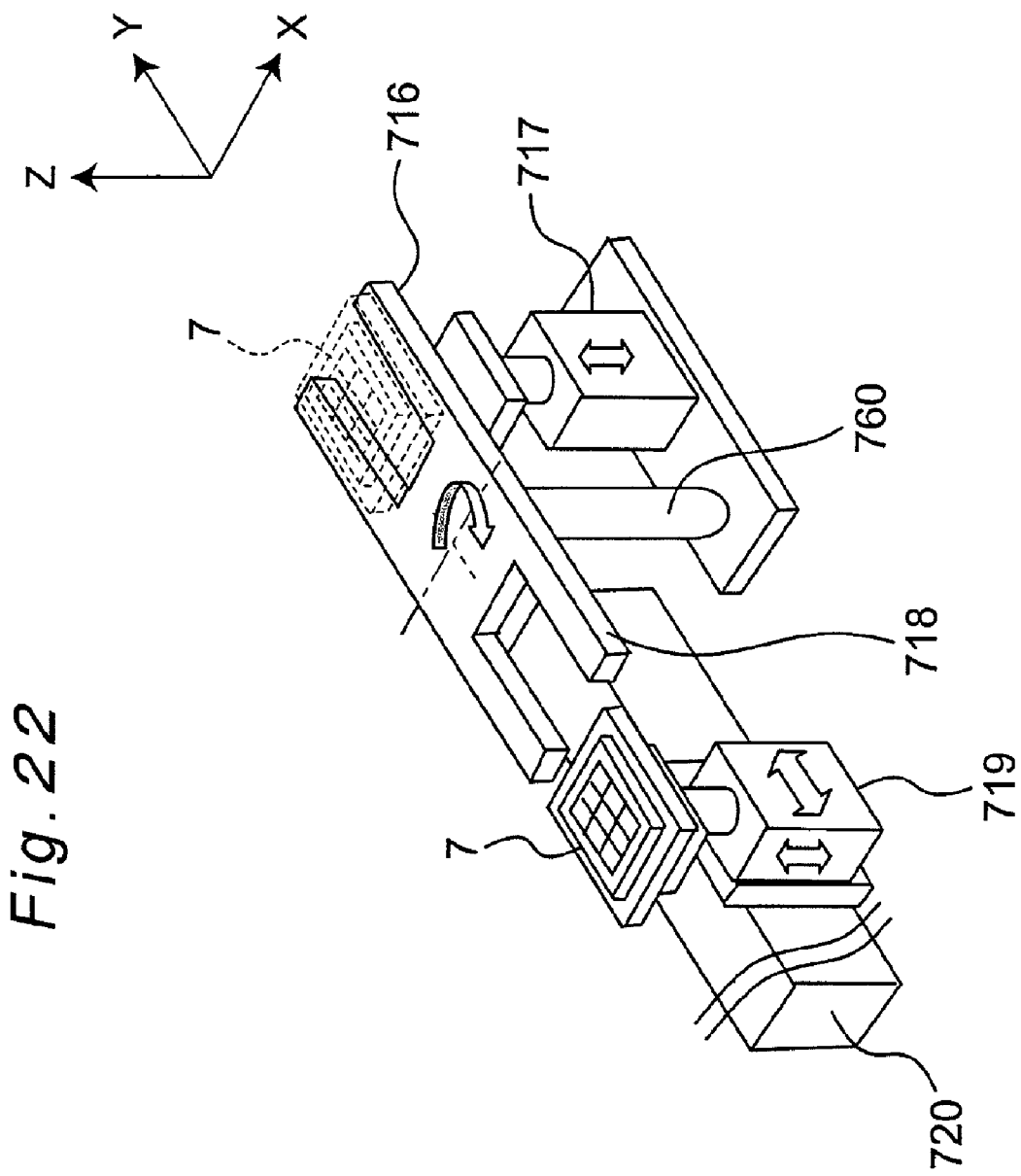
FIG. 22 is a schematic partial perspective view of the stacking tray supply unit of FIG. 20.

Next, a schematic plan view showing the schematic structure of a first stacking tray supply unit 701 of two stacking tray supply units provided for a component mounting apparatus according to the sixth embodiment of the invention is shown in FIG. 20, and a schematic side view of the apparatus is shown in FIG. 21. A schematic partial perspective view of the first stacking tray supply unit 701 is shown in FIG. 22. In the first stacking tray supply unit 701 of the sixth embodiment, the same constituent members (devices) as those of the component mounting apparatuses of the first through fifth embodiments are denoted by the same reference numerals, and no description is provided therefor.

In the fifth embodiment and its modification example, the case where the two tray stages provided at the stacking tray supply units are not rotationally transferred but displaced parallel in, for example, one direction has been described above. However, the sixth embodiment has a structure differing from that of the fifth embodiment in the point that rotational transfer is further combined with the parallel displacement in one direction. The following description is made on the basis of mainly the difference of the structure. Moreover, since the component mounting apparatus of the sixth embodiment is common to the fifth embodiment in the point that two stacking tray supply units are provided, the structure and operation of the first stacking tray supply unit 701 is described representing the two stacking tray supply units.

As shown in FIGS. 20 through 22, the first stacking tray supply unit 701 has a rotational transfer unit 760 for selectively placing two tray stages 716 and 718 in the two positions of the component feeding position P10 and the standby tray placement position P13 arranged in the Y-axis direction by rotationally transferring the two tray stages 716 and 718 as in the rotational transfer unit 60 shown in FIG. 8. As shown in FIG. 22, the tray stages 716 and 718 are formed, for example, integrally and made rotatable around a center of rotation located between the stages by the rotational transfer unit 760. Stage lifts 717 and 719 are placed in the component feeding position P10 and the standby tray placement position P13, respectively, and the tray stages 716 and 718 can be selectively placed in locations above the stage lifts 717 and 719 by rotational transfer by the rotational transfer unit 760. Moreover, the stage lift 717 can move up the tray 7 by lifting the tray from the tray stage 716 or 718 positioned in the component feeding position P10. Further, the stage lift 719 can move up the tray 7 by lifting the tray 7 from the tray stage 718 or 716 positioned in the standby tray placement position P13.

Moreover, as shown in FIGS. 20 through 22, the first stacking tray supply unit 701 has a stage moving unit 720 for advancing and retreating the stage lift 719 along the Y-axis direction. The stage moving unit 720 moves the tray 7 retained on the stage lift 719 between the standby tray placement position P13, the tray supplying position P11 that is the position located below a supply side stocker 712 and the tray collecting position P12 that is the position located below a collection side stocker 714. Further, the components are picked up from the tray 7 placed in the component feeding position P10 of the first stacking tray supply unit 701 by the inverting head unit 8, and the inverting head unit 8 is provided at an inverting head moving unit 709. The inverting head moving unit 709 has a Y-axis shifter 709a that moves the inverting head unit 8 in the Y-axis direction while supporting the same and an X-axis shifter 709b that moves the Y-axis shifter 709a in the X-axis direction while supporting the same and is able to pick up the desired component by X-Y transfer of the inverting head unit 8 with respect to the tray 7 placed in the component feeding position P10.

A method for carrying out the component feeding from the tray 7 by the first stacking tray supply unit 701 structured as above is described. First, in a state in which the trays 7 are placed on the tray stages 716 and 718, a stage lift 717 positioned on the lower side of the tray stage 716 positioned in the component feeding position P10 is moved up to lift the tray 7 on the tray stage 716 to position the tray into a component feeding height position separated apart from the tray stage 716. Components are picked up from the tray 7 by the inverting head unit 8 in this state.

When the tray 7 enters the component depletion state, the stage lift 717 is moved down to deliver the tray 7 to the tray stage 716, and the stage lift 717 is further moved down and positioned into a retreat height position in the horizontal direction so as not to interfere with the tray stage 716. Likewise, the stage lift 719 is also moved down and positioned into the retreat height position. Subsequently, rotational transfer by the rotational transfer unit 760 is performed to position the tray stage 716 into the standby tray placement position P13 and to position the tray stage 718 into the component feeding position P10. Subsequently, the tray 7 on the tray stage 718 is lifted by the stage lift 717, and the components are picked up from the tray 7 by the inverting head unit 8.

On the other hand, in the standby tray placement position P13, the tray 7 in the empty state on the tray stage 716 is lifted and retained by the stage lift 719. Subsequently, the stage lift 719 is moved in the Y-axis direction by the stage moving unit 720 and positioned into the tray collecting position P12. After the tray 7 in the empty state is delivered from the stage lift 719 and collected to the collection side stocker 714 in the tray collecting position P12, the stage lift 719 is moved to the tray supplying position P11 by the stage moving unit 720, and a new tray 7 is delivered from the supply side stocker to the stage lift 719. Subsequently, the stage lift 719 is positioned into the standby tray placement position P13, and a new tray 7 is placed on the tray stage 716. By performing rotational transfer of the tray stages 716 and 718 by the rotational transfer unit 760, a state in which component feeding from the new tray 7 can be carried out is established.

By thus providing the rotational transfer unit 760 that rotationally transfers the two tray stages 716 and 718 for the stacking tray supply unit 701 of the sixth embodiment, either one or the other of the two tray stages 716 and 718 can be selectively positioned into the component feeding position P10 and the standby tray placement position P13. Moreover, such selective placement can be achieved by rotational transfer, and therefore, the selective placement can efficiently be achieved. Furthermore, by virtue of the provision of the stage moving unit 720 that moves the stage lift 719 so as to position the stage lift into the standby tray placement position P13, the tray supplying position P11 and the tray collecting position P12, the collecting operation of the tray 7 in the empty state and the supplying operation of a new tray 7 can be carried out without exerting influence on the component pickup operation from the tray 7 positioned in the component feeding position P10. Therefore, the component feeding from the plurality of trays 7 can be continuously carried out, and more efficient component feeding can be achieved.

Although the stacking tray supply unit 701 of the sixth embodiment has been described taking the structure such that the stage lift 717 positioned in the component feeding position P10 is not moved in the Y-axis direction but stationarily placed as an example, the stacking tray supply unit 701 of the sixth embodiment is not limited only to such a structure. In place of the above case, it is also possible to adopt a structure such that a stage moving unit 880 for advancing and retreating the stage lift 717 in the Y-axis direction is further provided as in a stacking tray supply unit 801 according to a modification example of the sixth embodiment shown in, for example, the schematic plan view of FIG. 23 and the schematic side view of FIG. 24.

Figure 23:
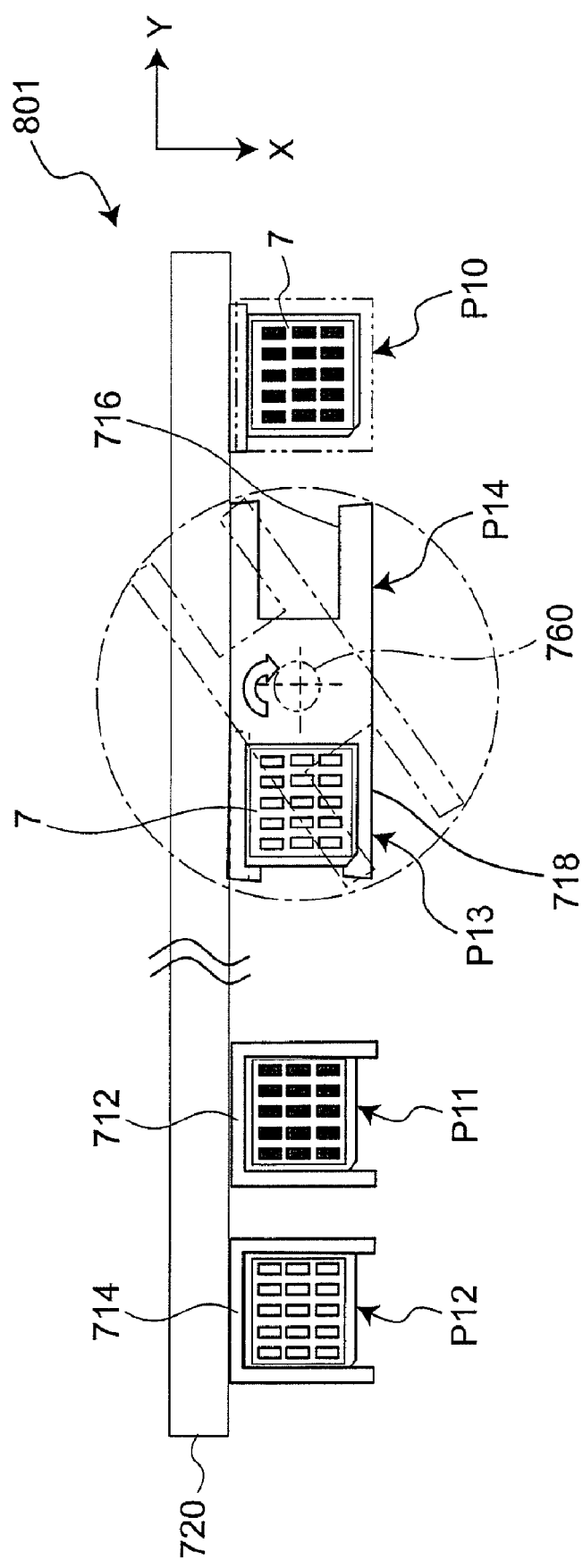
FIG. 23 is a schematic plan view of a stacking tray supply unit according to a modification example of the sixth embodiment.
Figure 24:
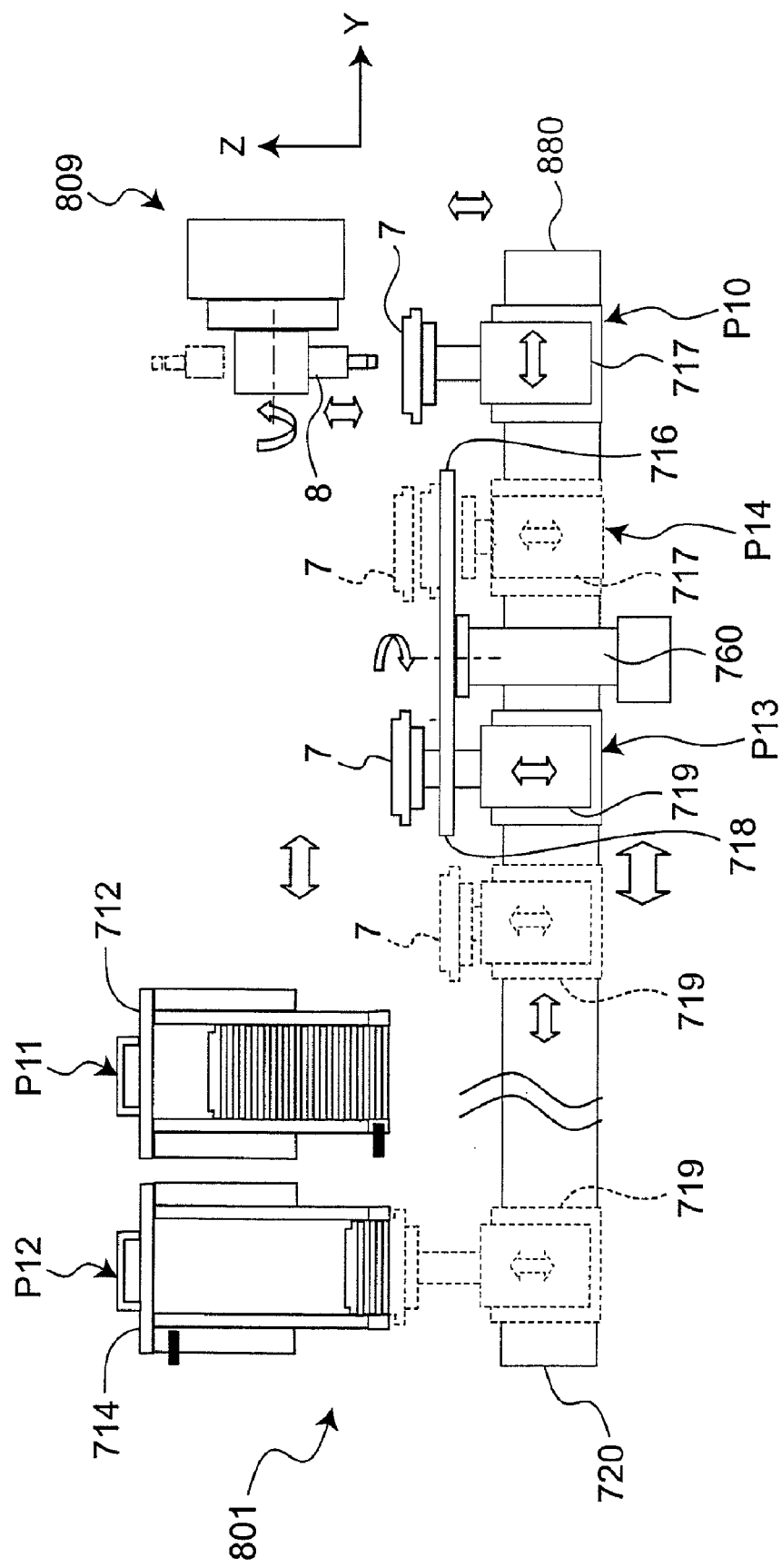
FIG. 24 is a schematic side view of the stacking tray supply unit of FIG. 23.

As shown in FIGS. 23 and 24, the two tray stages 716 and 718 are rotationally transferably provided so as to be positioned selectively into the standby tray placement position P13 and the feeding tray placement position P14 by the rotational transfer unit 760 in the stacking tray supply unit 801. Further, the stage moving unit 880 for advancing and retreating the stage lift 717 between the feeding tray placement position P14 and the component feeding position P10 arranged along the Y-axis direction is provided.

In the structure of the modification example of the sixth embodiment as described above, the tray 7 positioned in the component feeding position P10 can be moved in the Y-axis direction by the stage moving unit 880. Therefore, by making the inverting head unit 8 movable in the X-axis direction by the inverting head unit 8, relative X-Y transfer between the inverting head unit 8 and the tray can be achieved. Therefore, the structure of the inverting head moving unit 809 can be simplified.

Figure 25:
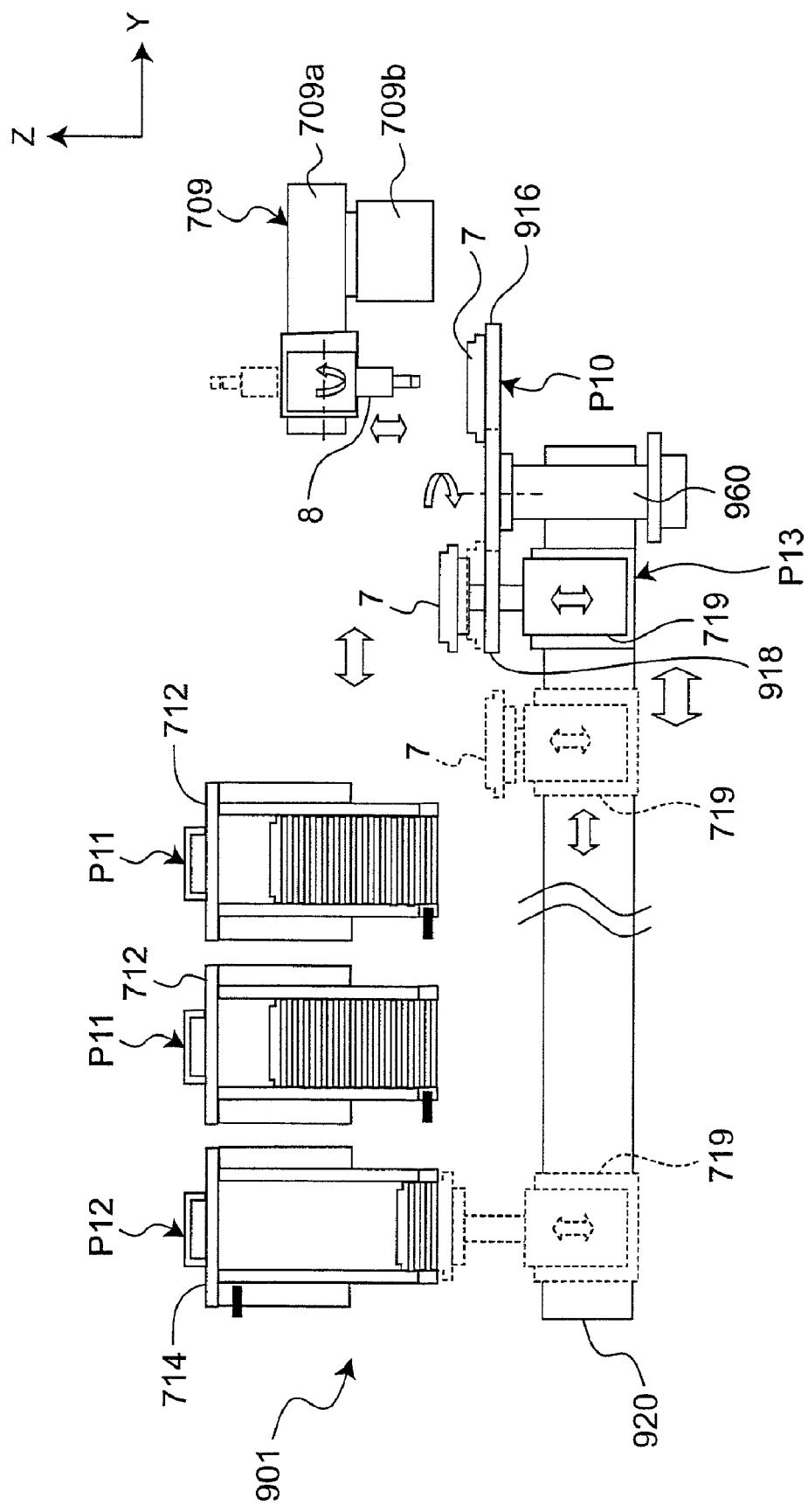
FIG. 25 is a schematic side view of a stacking tray supply unit according to another modification example of the sixth embodiment.
Figure 26:
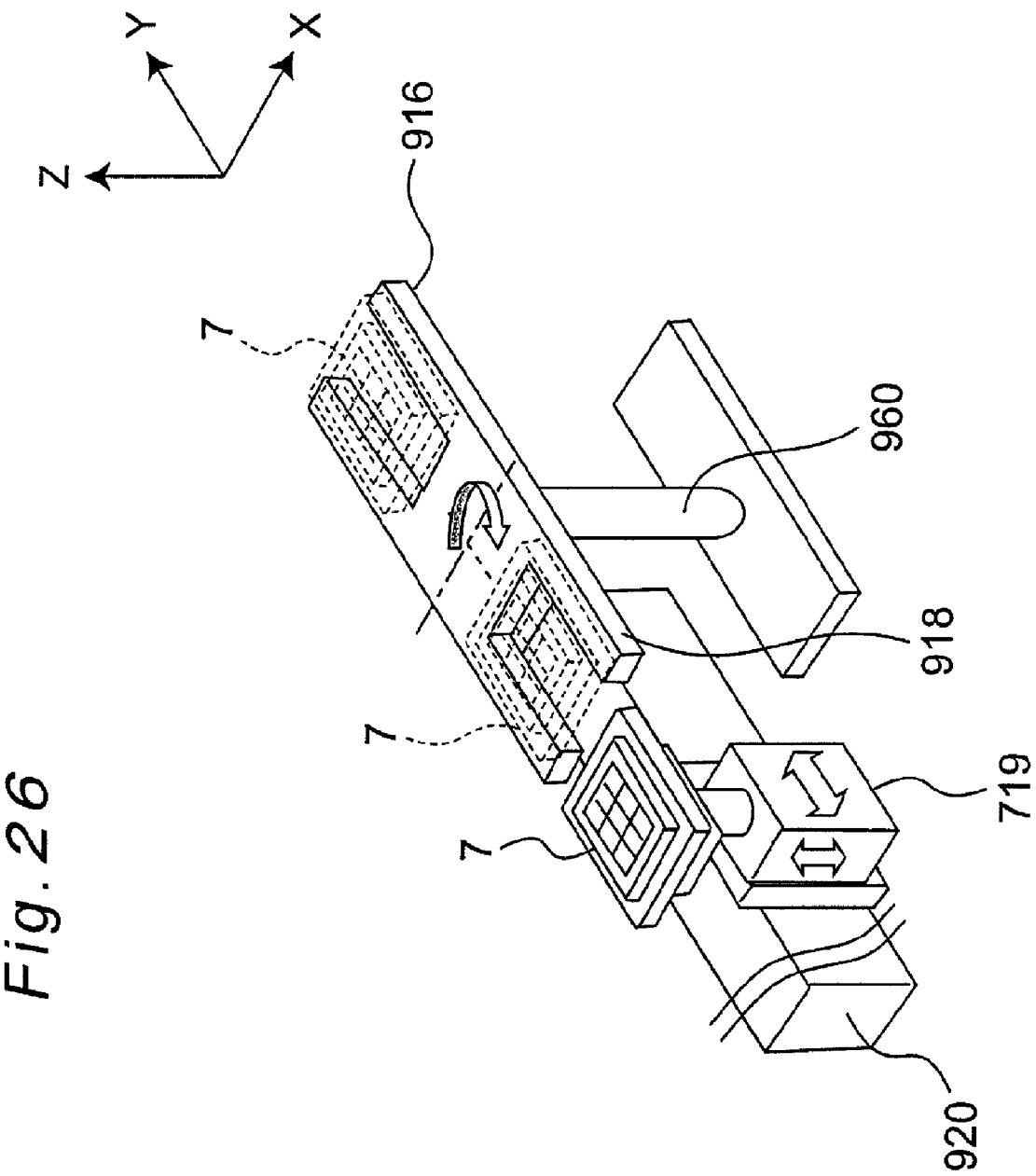
FIG. 26 is a schematic partial perspective view of the stacking tray supply unit of FIG. 25.

Moreover, the first stacking tray supply unit of the sixth embodiment may adopt the structure of a stacking tray supply unit 901 shown in FIGS. 25 and 26.

As shown in FIG. 25, two supply side stockers 712 are arranged along the Y-axis direction in the stacking tray supply unit 901. Trays 7 in which, for example, components of mutually different types are stored are received in the supply side stockers 712. The tray supplying position P11 is arranged below the supply side stockers 712, and two tray supplying positions P11 and one tray collecting position P12 are arranged in the stacking tray supply unit 901.

In the stacking tray supply unit 901 structured as above, while, for example, component feeding is carried out in the component feeding position P10, the stage lift 719 positioned in the standby tray placement position P13 is moved in the Y-axis direction by the stage moving unit 920 and positioned into the tray collecting position P12 to collect the tray 7 to the collection side stocker 714. Subsequently, the stage lift 719 is moved to the tray supplying position P11 located below the supply side stocker 712 that receives the trays 7 in which the components of different types are stored to receive a new tray 7, and the stage lift 719 is moved to the standby tray placement position P13 to place the new tray 7 on the tray stage. By carrying out the operation as described above, the switchover of the trays 7 in which the components of different types are stored can be smoothly achieved, and this can efficiently cope with the feeding of components of a plurality of types. Although the case where the two supply side stockers 712 are provided has been described as one example, it is possible to adopt a structure equipped with a plurality of supply side stockers 712 and a plurality of collection side stockers 714.

Moreover, as shown in FIGS. 25 and 26, a structure in which no stage lift is provided in the component feeding position P10 is adopted for the stacking tray supply unit 901. Therefore, a mechanism (not shown) for retaining by suction or mechanically retaining the placed tray 7 is provided at the tray stages 916 and 918.

According to the structure as described above, the tray stages 916 and 918 are rotationally transferred by the rotational transfer unit 960 in a state in which the tray 7 placed on the tray stage 916 or 918 in the standby tray placement position P13 is retained by the tray stage 916 or 918. Subsequently, in a state in which the tray 7 is positioned in the component feeding position P10, component feeding can be carried out without lifting the tray 7 by the tray stage 916 or 918 positioned in the tray supplying position P10. Therefore, the apparatus structure can be simplified, and the time necessary for bringing the tray 7 into the state in which the component feeding can be carried out can be shortened, and efficient component feeding becomes possible. If a structure such that three or more tray stages are arranged, for example, in a radial form with respect to the center of rotation of the rotational transfer unit 960 is adopted, more efficient component feeding can be achieved.

The structure of a component mounting apparatus 1000 according to a further modification example of the sixth embodiment is described with reference to the schematic plan view of FIG. 27.

Figure 27:
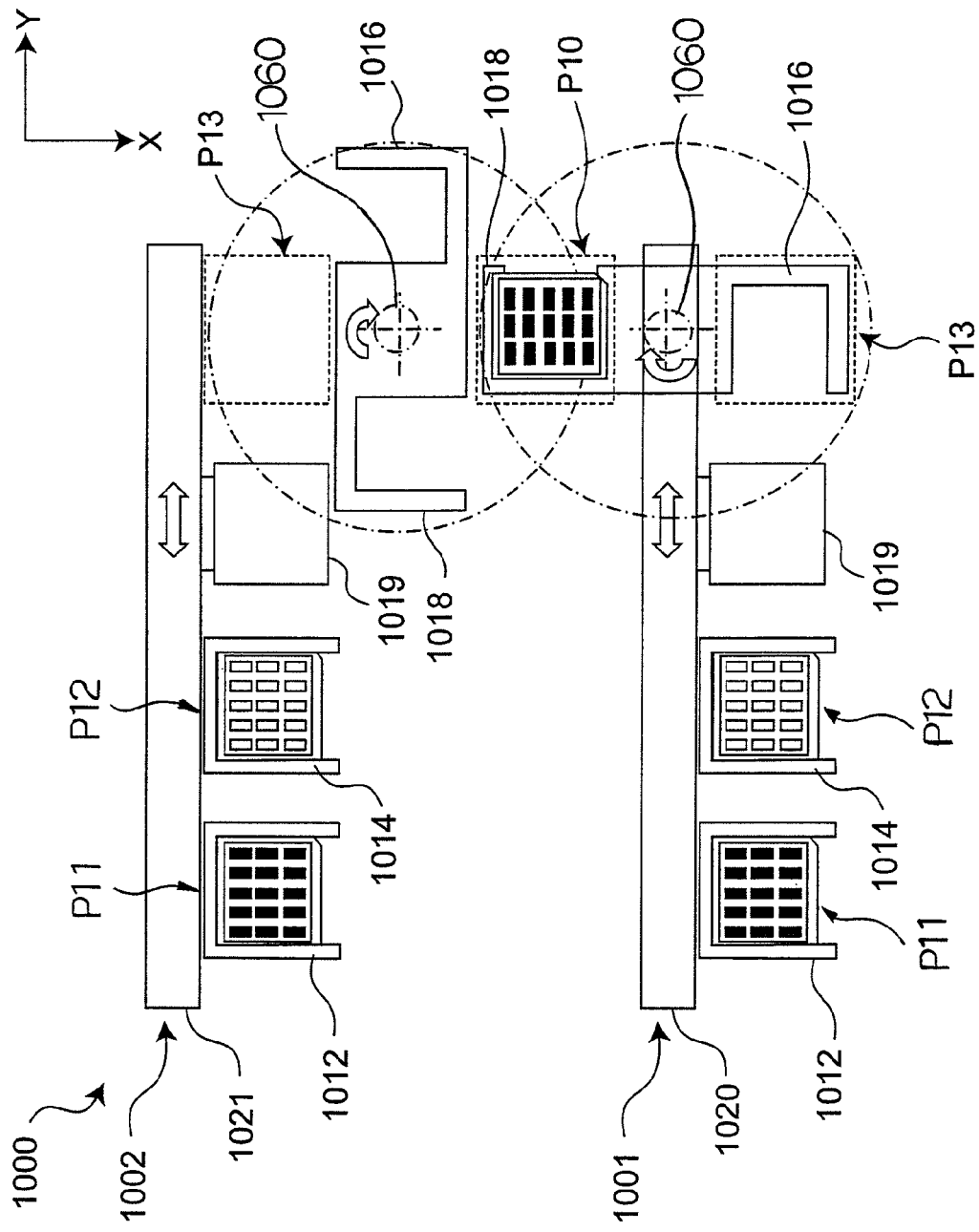
FIG. 27 is a schematic plan view of a stacking tray supply unit according to yet another modification example of the sixth embodiment.

As shown in FIG. 27, the component mounting apparatus 1000 has a structure having two stacking tray supply units including a stage moving unit for advancing and retreating one stage lift 1019 along the Y-axis direction. A first stacking tray supply unit 1001 has a stage moving unit 1020 for advancing and retreating a stage lift 1019 along the Y-axis direction between the tray supplying position P11 that is a position located below a supply side stocker 1012 arranged along the Y-axis direction, the tray collecting position P12 that is a position located below a collection side stocker 1014 and a standby position P13. Moreover, a rotational transfer unit 1060 to rotationally transfer two tray stages 1016 and 1018 is provided at the right-hand end in the illustrated Y-axis direction of the stage moving unit 1020. Moreover, the standby position P13 and the component feeding position P10 are arranged along, for example, the X-axis direction substantially perpendicular to the Y-axis direction. A rotational transfer unit 1060 can rotationally transfer the two tray stages 1016 and 1018 selectively into the standby position P13 or the component feeding position P10.

Moreover, as shown in FIG. 27, a second stacking tray supply unit 1002 has the same structure as that of the first stacking tray supply unit 1001. A stage moving unit 1021 for advancing and retreating the stage lift 1019 in the Y-axis direction while allowing the tray 7 to be received and delivered between the tray stage 1016 or 1018 positioned in the standby position P13 and the tray supplying position P11 and the tray collecting position P12 is provided.

Further, as shown in FIG. 27, the component feeding position P10 is a position shared between the first and second stacking tray supply units 1001 and 1002, and two standby positions P13 and one shared component feeding position P10 are arranged along the X-axis direction. Moreover, the tray stages 1016 and 1018 have the respective cut shapes determined so that the tray 7 can be placed from the stage lift 1019 when positioned in the standby position P13.

By adopting the structure as described above, by first carrying out component feeding from the tray 7 on the tray stage 1018 positioned in the component feeding position P10 by the first stacking tray supply unit 1001 and performing rotational transfer of the tray stages by the rotational transfer unit 1060, the component feeding can be continued by replacing the tray stage 1016 positioned in the standby position P13 with the tray stage 1018 positioned in the component feeding position P10.

Further, by bringing the tray stages 1016 and 1018 into a state in which they are arranged in the Y-axis direction by rotational transfer (state in which mutual interference is avoided) in the first stacking tray supply unit 1001 and rotationally transferring the tray stages by the rotational transfer unit 1060 in the second stacking tray supply units 1002, the tray stage 1016 or 1018 of the second stacking tray supply unit 1002 can be positioned into the component feeding position P10. By this operation, component feeding can be carried out by selectively positioning either one of the tray stages 1016 and 1018 of the first stacking tray supply unit 1001 or the second stacking tray supply unit 1002 into one component feeding position P10. Therefore, components of mutually different types can be fed by, for example, the first and second stacking tray supply units 1001 and 1002, and the component feeding can efficiently be carried out.

The above description has been based on the mode in which each tray is supplied from the stockers where the plurality of trays storing components of the same type are received in a stacked state. However, in place of the above case, there may also be an application to a component feeding mode such that a plurality of trays storing components of different types are received mixedly loaded in a magazine to cope with feeding of components of various types.

It is to be noted that, by properly combining the arbitrary embodiments of the aforementioned various embodiments, the effects possessed by them can be produced.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

The entire disclosures of Japanese Patent Application No. 2007-14406 filed on Jan. 25, 2007 and Japanese Patent Application No. 2007-14407 filed on Jan. 25, 2007, including specifications, drawings and claims, are incorporated herein by reference in their entirety.

The invention claimed is:

1. A component feeding method for delivering a tray from a supply side tray receiving unit which receives trays that store components to be mounted onto a board and placing the tray on a tray stage to allow the components to be fed from the tray stage and thereafter moving the tray stage on which the tray that has undergone component feeding is placed to receive the tray into a collection side tray receiving unit and collect the tray, comprising:

positioning a first tray stage on which the tray supplied from the supply side tray receiving unit is placed into a feeding tray placement position where the tray to undergo component feeding is positioned and positioning a second tray stage on which another tray supplied from the supply side tray receiving unit is placed into a standby tray placement position located on a concentric circle with the feeding tray placement position;

carrying out component feeding from the tray placed on the first tray stage positioned in the feeding tray placement position;

thereafter moving the first and second tray stages on the concentric circle to position the second tray stage into the feeding tray placement position and continuously carrying out component feeding from the other tray placed on the second tray stage;

thereafter performing delivery of the tray between the first or second tray stage positioned in the standby tray placement position, the supply side tray receiving unit and the collection side tray receiving unit.

2. A component mounting method comprising:

feeding components of mutually different types from respective feeding systems to a mounting head device by carrying out the component feeding method as defined in claim 1 by two supplying systems;

mounting the components fed by the supplying systems onto the board by the mounting head device; and moving the tray stage positioned in the feeding tray placement position into a shared component feeding position which is a position where interference with the tray stages in the other supplying system is prevented and which is used in common by the supplying systems to carry out the component feeding to the mounting head device in one supplying system while performing delivery of the tray between the tray stage positioned in the standby tray placement position and the supply side tray receiving unit and the collection side tray receiving unit in the other supplying system.

3. The component mounting method as defined in claim 2, wherein the rotational transfer of the tray stages for switchover between the tray stage positioned in the shared component feeding position and the tray stage positioned in the standby tray placement position is carried out in the one supplying system while the rotational transfer of the tray stages for switchover between the tray stage positioned in the feeding tray placement position and the tray stage positioned in the standby tray placement position is carried out in the other supplying system.

4. A component mounting method comprising:

by selecting the component feeding method as defined in claim 1, feeding the component of the first type stored in the tray to the mounting head device and mounting the component of the first type onto the board by the mounting head device;

by selecting a component feeding mode different from that of the tray, feeding the component of the second type different from the first type to the component mounting head device and mounting the component of the second type onto the board by the component mounting head device; and performing delivery of the tray between the tray stage positioned in the standby tray placement position and the supply side tray receiving unit and the collection side tray receiving unit while the component feeding in the different component feeding mode is selected and carried out.

* * * * *